(12) United States Patent
Tarutani

(10) Patent No.: US 7,294,450 B2
(45) Date of Patent: Nov. 13, 2007

(54) CHEMICAL AMPLIFICATION-TYPE RESIST COMPOSITION AND PRODUCTION PROCESS THEREOF

(75) Inventor: Shinji Tarutani, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 11/493,517

(22) Filed: Jul. 27, 2006

(65) Prior Publication Data

US 2007/0026343 A1 Feb. 1, 2007

(30) Foreign Application Priority Data

Jul. 28, 2005 (JP) .......................... P2005-219198

(51) Int. Cl.
*G03F 7/039* (2006.01)
*G03F 7/16* (2006.01)

(52) U.S. Cl. ................ 430/270.1; 430/914; 430/935

(58) Field of Classification Search ............. 430/270.1, 430/914, 935
See application file for complete search history.

(56) References Cited

U.S. PATENT DOCUMENTS

| 5,521,052 | A * | 5/1996 | Rahman et al. .......... 430/270.1 |
| 6,447,980 | B1 * | 9/2002 | Rahman et al. .......... 430/270.1 |
| 6,610,465 | B2 * | 8/2003 | Rahman et al. .......... 430/327 |
| 6,723,486 | B2 * | 4/2004 | Goodall et al. .......... 430/270.1 |
| 2002/0061464 | A1 * | 5/2002 | Aoai et al. ............. 430/270.1 |
| 2004/0191674 | A1 * | 9/2004 | Hanamoto et al. ....... 430/270.1 |
| 2006/0014098 | A1 * | 1/2006 | Hada et al. ............. 430/270.1 |

FOREIGN PATENT DOCUMENTS

| JP | 10-232492 A | 9/1998 |
| JP | 10-512970 A | 12/1998 |
| JP | 2001-350266 A | 12/2001 |
| JP | 2002-62667 A | 2/2002 |
| JP | 2003-330202 A | 11/2003 |
| JP | 2004-212975 A | 7/2004 |
| JP | 2004-523806 A | 8/2004 |
| JP | 2004-326092 A | 11/2004 |
| WO | WO 2004/057422 | * 7/2004 |

* cited by examiner

*Primary Examiner*—Richard L. Schilling
(74) *Attorney, Agent, or Firm*—Sughrue Mion Pllc.

(57) ABSTRACT

A production process of a chemical amplification-type resist composition, which is a process for producing a chemical amplification-type composition comprising: (A) a compound capable of generating an acid upon irradiation with actinic rays or radiation; (B) a resin of which solubility in an alkali developer is changed under an action of an acid; (C) a basic compound; (D) a surfactant; and (E) a solvent, the production process comprising: preparing a solution containing the component (A); and mixing the solution containing the component (A) with the components (B) to (E), and a chemical amplification-type resist composition produced by the production process.

16 Claims, No Drawings

CHEMICAL AMPLIFICATION-TYPE RESIST COMPOSITION AND PRODUCTION PROCESS THEREOF

BACKGROUND OF THE INVENTION

1. Field of the Invention

The present invention relates to a production process of a chemical amplification-type positive or negative resist composition for use in the process of producing a semiconductor such as IC, in the production of a circuit board for liquid crystal, thermal head and the like, or in other photofabrication processes. More specifically, the present invention relates to a production process of a chemical amplification-type positive or negative resist composition suitable for exposure using a light source of emitting a far ultraviolet ray or the like of 250 nm or less.

2. Description of the Related Art

The chemical amplification-type positive resist composition is a pattern forming material which is sparingly soluble or insoluble in a developer immediately after the film formation on a substrate but produces an acid in the exposed area upon irradiation with radiation such as far ultraviolet ray and through a reaction using this acid as the catalyst, increases the solubility of the actinic radiation-irradiated area in a developer, thereby forming a pattern on the substrate. Also, the chemical amplification-type negative resist composition is a pattern forming material which is easily soluble in a developer immediately after the film formation on a substrate but produces an acid in the exposed area upon irradiation with radiation such as far ultraviolet ray and through a reaction using this acid as the catalyst, decreases the solubility of the actinic radiation-irradiated area in a developer, thereby forming a pattern on the substrate.

As described, for example, in JP-A-2002-296779 (the term "JP-A" as used herein means an "unexamined published Japanese patent application"), the chemical amplification-type resist composition for the processing using a light source (radiation source) such as KrF excimer laser, ArF excimer laser, F2 excimer laser, EUV (extreme ultraviolet light) and EB (electron beam) generally comprises a resin component, an acid generator component capable of generating an acid upon exposure, and an organic solvent capable of dissolving these components.

Such a chemical amplification-type resist composition is required to give a resist pattern with high resolution, high sensitivity and good profile.

In recent years, a high-resolution resist pattern of 0.11 microns or less is demanded, as a result, in addition to the above-described properties, the improvement of defect (surface defect) of the resist pattern after development is required more strongly than ever.

This defect indicates troubles in general, for example, detected by a surface defect inspection apparatus ("KLA", trade name) manufactured by KLA-Tencor Corp. when the resist pattern after development is observed from right above. Examples of the trouble include scum after development, bubble, dust and bridge between resist patterns.

In order to improve such a defect, the efforts heretofore mainly attempted are centered on the resist composition, such as resin component, acid generator component and solvent component of the resist composition [JP-A-2001-56556].

Furthermore, generation of a fine particle during storage of the resist solution (resist composition in the solution state), that is, the foreign matter aging property (the property that a solid-state foreign matter is generated in the resist composition while the resist composition is stored; storage stability) of the resist solution, is also a problem and improvement thereof is demanded.

In order to improve this foreign matter aging property, similarly to the above, efforts centered on the resist composition have been attempted [JP-A-2001-22072].

However, the effects of the techniques described in JP-A-2001-56556 and JP-A-2001-22072 are not yet sufficient.

In addition, the generation of a fine particle may give rise to the above-described defect, and improvement of the foreign matter aging property is strongly demanded also from the standpoint of improving the defect.

However, a method capable of sufficiently improving the defect of resist pattern after development and the storage stability has been heretofore not known.

Meanwhile, JP-A-2002-62667 has proposed a production process of a resist composition, where the amount of a fine particle in the resist composition circulating in the line is reduced by passing the resist composition through a filter.

As described in JP-A-2002-62667, in the production of a resist composition, it is known to produce a resist composition and pass the composition through a filter, but even such a process is not enough to satisfactorily improve the defect of resist pattern after development and the storage stability.

Also, JP-A-2001-350266 has proposed a production process of a resist composition, where the resist composition is passed through a filter having a positive zeta potential. However, when the resist composition is treated by the method described in JP-A-2001-350266, the constitution of the composition is sometimes changed. This change in the constitution disadvantageously causes change in the sensitivity of the resist composition or in the resist pattern size.

JP-A-2001-350266 has proposed a production process of a resist composition, where the resist composition is passed through a filter having a negative zeta potential. However, as for the defect of the resist pattern, in the case of forming the recently demanded fine resist pattern such as resist pattern of 110 nm or less by using a KrF excimer laser or a light source developed thereafter, such as KrF excimer laser, ArF excimer laser, F2 excimer laser, EUV and EB, the problem of defect becomes severer and the above-described production process is not enough to solve the problem.

JP-A-2004-212975 discloses a technique of passing the resist composition through a filter comprising a membrane having a specific zeta potential so as to provide a resist composition ensuring that generation of a defect in the resist pattern after development can be suppressed.

That is, the defect such as fine scum or microbridge after development becomes a severer problem along with miniaturization of the pattern, and it is a very important concern to suppress the defect. However, none of those conventional techniques is successful in satisfactorily solving this problem.

Also, JP-A-10-232492 discloses a technique where in the preparation of a resist for i-line, the raw materials are mixed each in the form of a solution to enhance the charging accuracy and thereby enhance the dimensional accuracy of the resist pattern obtained from the composition.

JP-T-10-512970 (the term "JP-T" as used herein means a "published Japanese translation of a PCT patent application") discloses a method of, in the preparation of a resist, using a novolak resin in which the metal ion amount is reduced with the use of an ion exchange resin.

JP-T-2004-523806 discloses a technique of reducing the metal amount and enhancing the film-forming property by filtering the resin solution.

JP-A-2004-326092 discloses, in the preparation of a resist, performing a treatment of bringing a resin into contact with activated carbon.

JP-A-2003-330202 discloses a method of filtering a resin solution so as to prevent the resist from deterioration with time.

SUMMARY OF THE INVENTION

The present invention has been made under these circumstances and an object of the present invention is to provide a technique of giving a resist composition ensuring that generation of a defect, particularly, fine scum or microbridge, in the resist pattern after development can be suppressed. Another object of the present invention is to provide a technique of giving a resist composition excellent in the foreign matter aging property (storage stability).

The present invention has the following constitutions and the above-described objects of the present invention can be achieved by these constitutions.

(1) A production process of a chemical amplification-type resist composition, which is a process for producing a chemical amplification-type composition comprising: (A) a compound capable of generating an acid upon irradiation with actinic rays or radiation; (B) a resin of which solubility in an alkali developer is changed under an action of an acid; (C) a basic compound; (D) a surfactant; and (E) a solvent, the production process comprising:

preparing a solution containing the component (A); and mixing the solution containing the component (A) with the components (B) to (E).

(2) The production process of a chemical amplification-type resist composition as described in (1) above, which further comprises:

preparing a solution containing the component (B); and mixing the solution containing the component (B) with the solution containing the component (A).

(3) The production process of a chemical amplification-type resist composition as described in (1) above, which comprises:

preparing four solutions containing the components (A) to (D), respectively; and mixing the components (A) to (E) with each other as solutions.

(4) The production process of a chemical amplification-type resist composition as described in any of (1) to (3) above, which further comprises:

filtering the solution containing the component (B) through a first filter.

(5) The production process of a chemical amplification-type resist composition as described in (4) above, wherein the first filter has an average pore size of 2.0 μm or less.

(6) The production process of a chemical amplification-type resist composition as described in any of (1) to (5) above, which further comprises:

filtering the solution containing the component (A) through a second filter.

(7) The production process of a chemical amplification-type resist composition as described in (6) above, wherein the second filter has an average pore size of 0.4 μm or less.

(8) The production process of a chemical amplification-type resist composition as described in any of (3) to (7) above, which further comprises:

filtering the two solutions containing the components (C) and (D), respectively through a second filter.

(9) The production process of a chemical amplification-type resist composition as described in (8) above, wherein the second filter has an average pore size of 0.4 μm or less.

(10) The production process of a chemical amplification-type resist composition as described in any of (1) to (9) above, which further comprises:

filtering the mixed solution containing the components (A) to (E) through a third filter having an average pore size of 0.05 μm or less.

(11) A chemical amplification-type resist composition produced by a production process as described in any of (1) to (10) above.

DETAILED DESCRIPTION OF THE INVENTION

The production process of a chemical amplification-type resist composition of the present invention is characterized in that a resist composition is produced by mixing raw materials each in the solution state and thereby, increase of a defect or a particle in aging is suppressed. At least a solution containing a compound capable of generating an acid upon irradiation with actinic rays or radiation (component (A)) is previously prepared and used for the preparation of a resist composition.

In the case of adding raw materials in the form of a powder to a solvent as in the conventional technique, an aggregate using the raw material particle as a core is produced and this leads to the increase of a defect or a particle.

As for the raw material readily becoming a core of an aggregate, the component (A) and a resin of which solubility in an alkali developer is changed under the action of an acid (component (B)) come under this material. A method of preparing a solution containing the component (A) and a solution containing the component (B) and using these solutions for the preparation of a resist composition is more preferred, and a method of previously dissolving all raw materials each in a solvent and mixing the raw materials by using the solutions (raw material solutions) is most preferred.

As for the solvent used in the preparation of solutions of raw materials such as components (A) to (D), the component (E) is used. In the case where two or more solvents are used as the component (E), one of these solvents may be used, a plurality thereof may be used or all solvents may be used. In the case of using a plurality of solvents as the component (E), the volume ratio thereof may be freely selected.

The concentration of the raw material in the raw material solution may be sufficient if it is not higher than the concentration at which the raw material can be satisfactorily dissolved, but the concentration is preferably 80% or less of the saturation solubility L in the solvent for the raw material at a resist preparation temperature.

L(%)=(mass of raw material at dissolution to saturation/volume of solvent)×100

In the case of using two or more kinds of raw materials for the same component (for example, two kinds of photoacid generators), a solution may be prepared every each raw material or a mixed solution containing two or more kinds of raw materials may be prepared, but it is preferred to prepare a solution every each raw material.

Furthermore, when a method of mixing these raw material solutions after filtering each solution through a filter is employed, a fine particle present in the solution and capable of becoming a core of an aggregate can be more reduced and this is preferred.

The filter used for filtering the raw material solution is selected from those used in the resist field and specifically, a filter formed of a material comprising a polyethylene, a polypropylene, a polytetrafluoroethylene, a nylon or a polysulfone is used. More specific examples thereof include Microgard, Microgard Plus, Microgard Minichem-D, Microgard Minichem-D PR, Millipore Optimizer DEV/DEV-C and Millipore Optimizer 16/14 manufactured by Millipore Corp.); and Ultibore N66, Posidyne and Nylon Falcon manufactured by Pall Corp.

In the case of filtering the component (B) solution through a filter, if the average pore size of the filter is too small, the filtration takes much time due to high viscosity of the solution and the production efficiency may decrease, whereas if the average pore size of the filter is excessively large, a fine particle present in the solution and capable of becoming a core of an aggregate passes through the filter and cannot be removed. Accordingly, the average pore size of the filter used for the filtration of the component (B) solution is preferably from 0.1 to 2.0 μm.

In the case of filtering a raw material solution except for the component (B) through a filter, the viscosity of the solution is not so high as that of the component (B) solution and therefore, the average pore size of the filter need not be so large as that of the filter for the component (B) solution. The average pore size is preferably from 0.1 to 0.4 μm.

Also, after all raw materials are mixed to prepare a uniform resist composition, this resist composition is preferably further filtered through a filter and the average pore size of the filter here is preferably 0.05 μm or less. The filter used for filtration of the resist composition may be a filter formed of the above-described material.

The solid content concentration in the final resist composition is generally from 1.0 to 30.0 mass %, preferably from 2.0 to 20.0 mass %. (In this specification, mass ratio is equal to weight ratio.)

Respective components are described in detail below, but the present invention is not limited thereto.

<Component (A): Compound Capable of Generating an Acid Upon Irradiation with Actinic Rays or Radiation>

As for the compound capable of generating an acid upon irradiation with actinic rays or radiation (hereinafter sometimes referred to as an "acid generator"), a photoinitiator for photocationic polymerization, a photoinitiator for photoradical polymerization, a photo-decoloring agent for coloring matters, a photo-discoloring agent, a compound capable of generating an acid upon irradiation with known light used for a microresist or the like (ultraviolet light at 400 to 200 nm or far ultraviolet light, preferably g-line, h-line, i-line or KrF excimer laser light) or with ArF excimer laser light, electron beam, X-ray, molecular beam or ion beam, or a mixture thereof may be appropriately selected and used.

Examples thereof include a diazonium salt, a phosphonium salt, a sulfonium salt, an iodonium salt, an imidosulfonate, an oxime sulfonate, a diazodisulfone, a disulfone and an o-nitrobenzyl sulfonate. Specific examples thereof include an onium salt such as diazonium salt described in S. I. Schlesinger, Photogr. Sci. Eng., 18, 387 (1974), and T. S. Bal et al., Polymer, 21, 423 (1980), ammonium salt described in U.S. Pat. Nos. 4,069,055, 4,069,056 and Re27, 992, and JP-A-3-140140, phosphonium salt described in D. C. Necker et al., Macromolecules, 17, 2468 (1984), C. S. Wen et al., Teh, Proc. Conf. Rad. Curing ASIA, p. 478, Tokyo, Oct. (1988), and U.S. Pat. Nos. 4,069,055 and 4,069,056, iodonium salt described in J. V. Crivello et al., Macromolecules, 10 (6), 1307 (1977), Chem. & Eng. News, Nov. 28, page 31 (1988), European Patent 104,143, U.S. Pat. Nos. 339,049 and 410,201, JP-A-2-150848 and JP-A-2-296514, sulfonium salt described in J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European Patents 370,693, 161,811, 410,201, 339,049, 233,567, 297,443 and 297,442, U.S. Pat. Nos. 3,902,114, 4,933,377, 4,760,013, 4,734,444 and 2,833,827, German Patents 2,904,626, 3,604, 580 and 3,604,581, JP-A-7-28237 and JP-A-8-27102, selenonium salt described in J. V. Crivello et al., Macromolecules, 10 (6), 1307 (1977), and J. V. Crivello et al., J. Polymer Sci., Polymer Chem. Ed., 17, 1047 (1979), and arsonium salt. described in C. S. Wen et al., Teh, Proc. Conf. Rad. Curing ASIA, p. 478, Tokyo, Oct. (1988); an organic halogen compound described in U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-212401, JP-A-63-70243 and JP-A-63-298339; an organic metal/an organic halide described in K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1896) and JP-A-2-161445; a photoacid generator having an o-nitrobenzyl type protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichman et al., J. Electrochem. Soc., Solid State Sci. Technol., 130 (6), F. M. Houlihan et al., Macromolecules, 21, 2001 (1988), European Patents 0,290,750, 046,083, 156,535, 271,851 and 0,388, 343, U.S. Pat. Nos. 3,901,710 and 4,181,531, JP-A-60-198538 and JP-A-53-133022; a compound capable of photochemically decomposing to generate a sulfonic acid, as represented by iminosulfonate, described in M. TUNOOKA et al., Polymer Preprints Japan, 35 (8), G. Berner et al., J. Rad. Curing, 13 (4), W. J. Mijs et al., Coating Technol., 55 (697), 45 (1983), Akzo, H. Adachi et al., Polymer Preprints, Japan, 37 (3), European Patents 0,199,672, 84,515, 044,115, 618,564 and 0,101,122, U.S. Pat. Nos. 4,371,605 and 4,431, 774, JP-A-64-18143, JP-A-2-245756 and JP-A-3-140109; a disulfone compound described in JP-A-61-166544 and JP-A-2-71270; and diazoketosulfone and diazodisulfone compounds described in JP-A-3-103854, JP-A-3-103856 and JP-A-4-210960.

Furthermore, a compound obtained by incorporating such a group or compound capable of generating an acid by the effect of light into the main or side chain of a polymer can be used, and examples thereof include the compounds described in M. E. Woodhouse et al., J. Am. Chem. Soc., 104, 5586 (1982), S. P. Pappas et al., J. Imaging Sci., 30 (5), 218 (1986), S. Kondo et al., Makromol. Chem., Rapid Commun., 9, 625 (1988), Y. Yamada et al., Makromol. Chem., 152, 153, 163 (1972), J. V. Crivello et al., J. Polymer Sci., Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029. In addition, the compounds capable of generating an acid by the effect of light described, for example, in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779,778 and European Patent 126, 712 may also be used.

The amount of the component (A) added is preferably from 0.1 to 20 mass %, more preferably from 0.5 to 10 mass %, still more preferably from 1 to 7 mass %, based on the entire solid content of the resist composition.

Preferred examples of the component (A) are set forth below, but the present invention is not limited thereto.

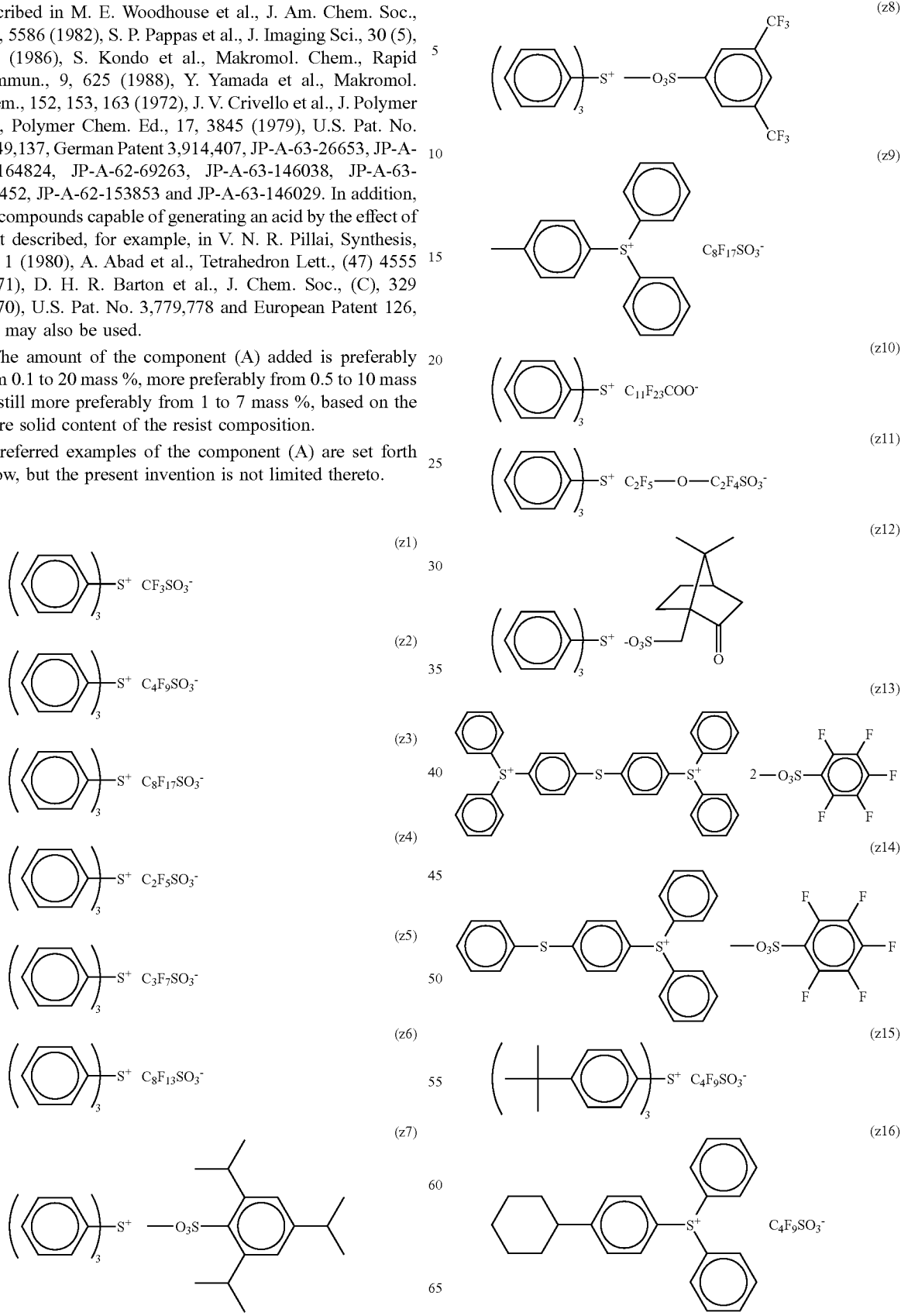

-continued
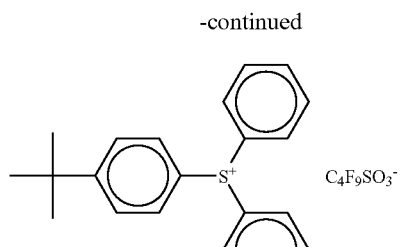 (z17)
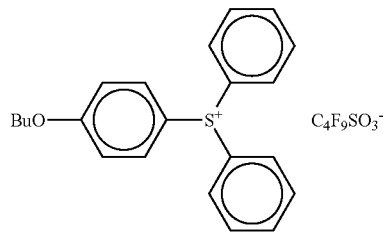 (z18)
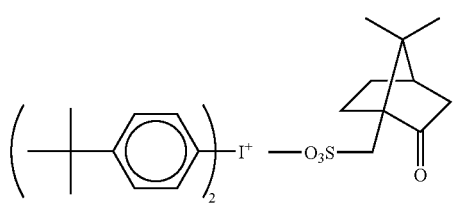 (z19)
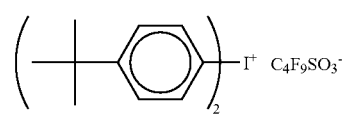 (z20)
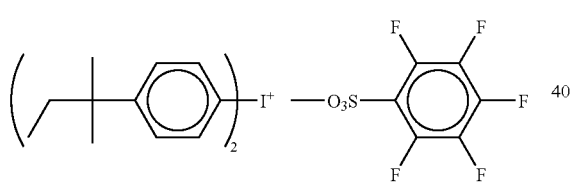 (z21)
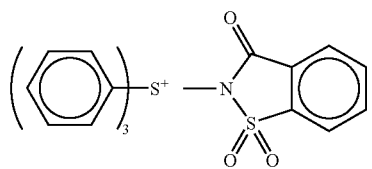 (z22)
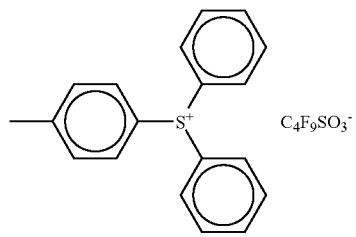 (z23)
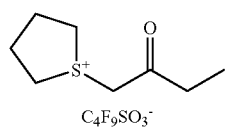 (z24)
-continued
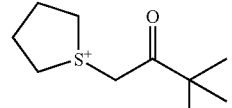 (z25)
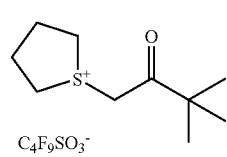 (z26)
(z27)
 (z28)
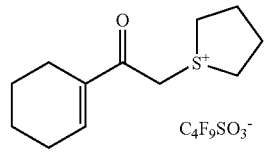 (z29)
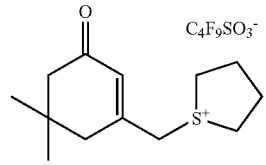 (z30)
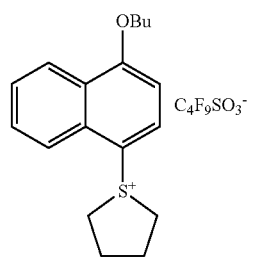 (z31)
(z32)
(z33)

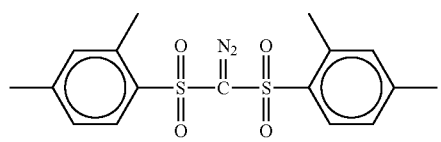
(z34)
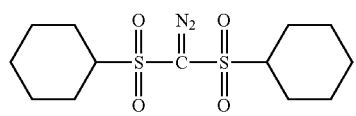
(z35)
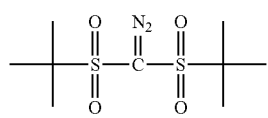
(z36)
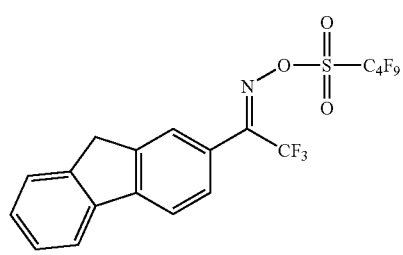
(z37)
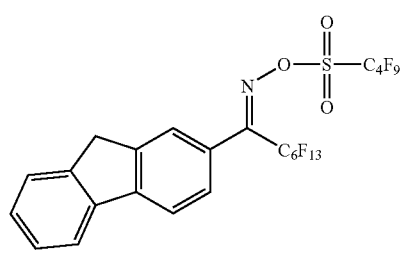
(z38)
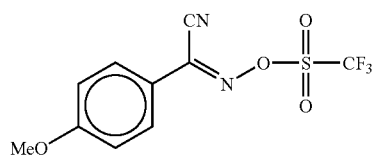
(z39)
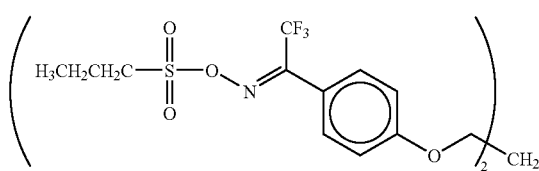
(z40)
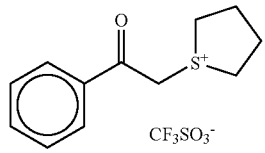
(z41)
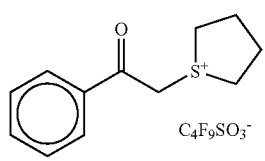
(z42)
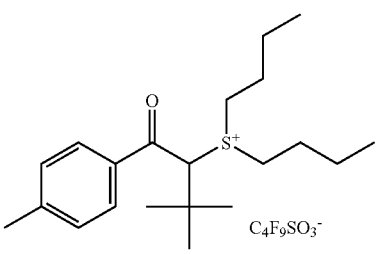
(z43)
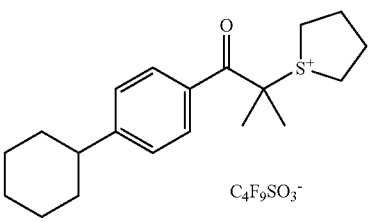
(z44)
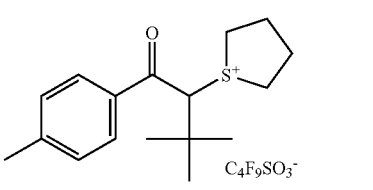
(z45)
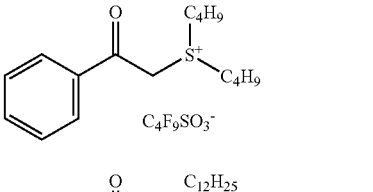
(z46)
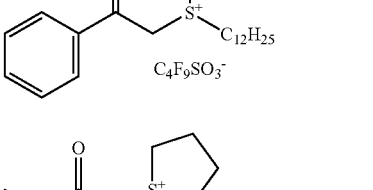
(z47)
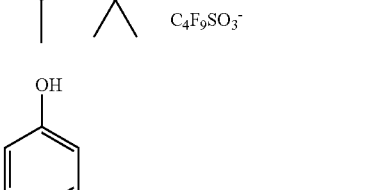
(z48)
(z49)
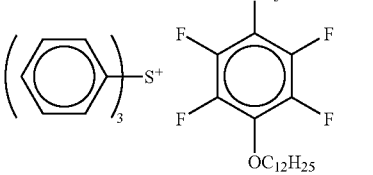
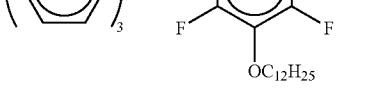
(z50)

-continued
(z51) 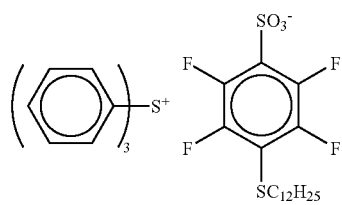
(z52) 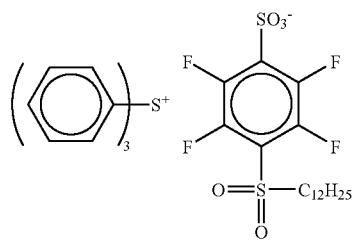
(z53) 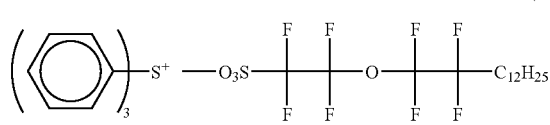
(z54) 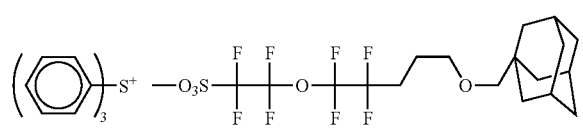
(z55) 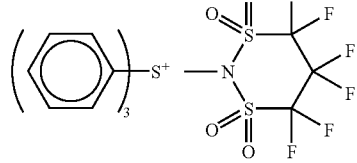
(z56) 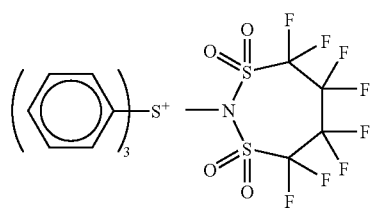
(z57) 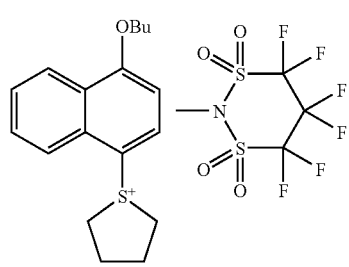
-continued
(z58) 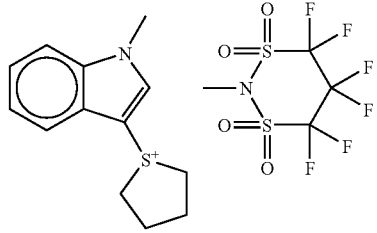
(z59) 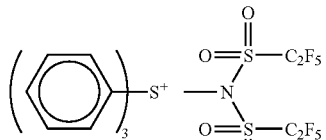
(z60) 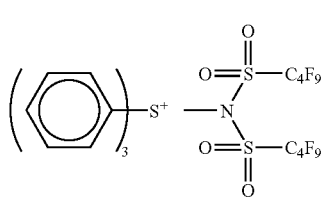
(z61) 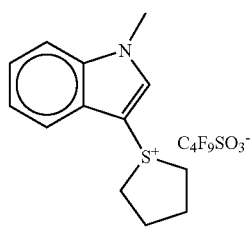
(z62) 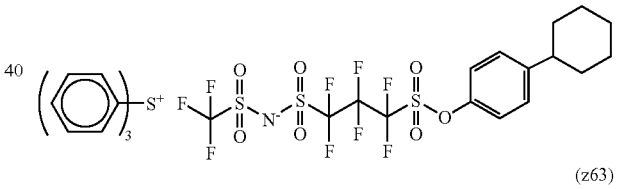
(z63) 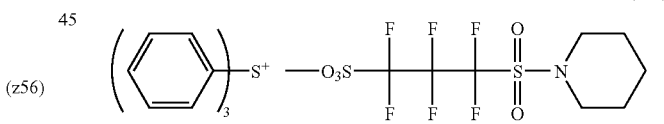
(z64) 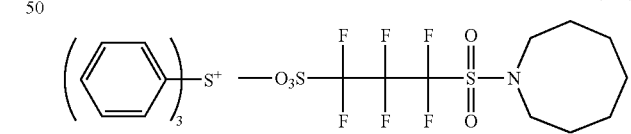
(z65) 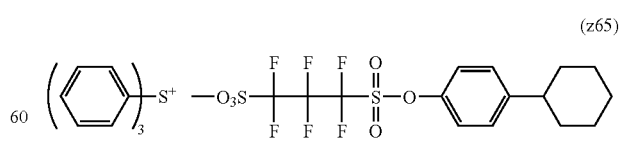
<Component (B): Resin of Which Solubility in an Alkali Developer is Changed Under the Action of an Acid>
The resin of which solubility in an alkali developer is changed under the action of an acid (hereinafter referred to as a "component (B)"), for use in the present invention, is a resin of which solubility in an alkali developer is changed by the effect of an acid generated from the compound capable of generating an acid upon irradiation with actinic rays or radiation.

The resist composition is a chemical amplification-type resist composition used with a light source (radiation source) having a wavelength of 250 nm or less, such as KrF excimer laser, ArF excimer laser, $F_2$ excimer laser, EUV (extreme ultraviolet light) and EB (electron beam), and any resin which is suitable for respective light sources may be used as the component (B).

Examples of the resin which can be used include the resins disclosed in JP-A-2005-10217, JP-A-11-84639 and Japanese Patent 3,116,751 for the positive resist by a KrF excimer laser, the resins disclosed in JP-A-2003-302670 and JP-A-2005-37414 for the negative resist by a KrF excimer laser, and the resins disclosed in JP-A-2005-37888, JP-A-2005-41857 and JP-A-2005-10217 for the positive resist by an ArF excimer laser.

The resin as the component (B), which decomposes by the effect of an acid to increase the solubility in an alkali developer, is a resin having a group capable of decomposing by the effect of an acid (hereinafter sometimes referred to as an "acid-decomposable group") in ether one or both of the main chain and the side chain thereof Of these, a resin having an acid-decomposable group in the side chain is preferred.

The group preferred as the acid-decomposable group is a group resulting from replacing the hydrogen atom of a —COOH or —OH group by a group which splits off by the effect of an acid.

In the present invention, the acid-decomposable group is preferably an acetal group or a tertiary ester group.

In the case where the acid-decomposable group is bonded as a side chain, the mother resin is an alkali-soluble resin having an —OH or —COOH group in the side chain. Examples thereof include an alkali-soluble resin described later.

The alkali dissolution rate of such an alkali-soluble resin is preferably 170 Å/sec or more, more preferably 330 Å/sec or more (Å is angstrom), as measured (at 23° C.) in 0.261N tetramethylammonium hydroxide (TMAH).

From this standpoint, the alkali-soluble resin is preferably an alkali-soluble resin having a hydroxystyrene structural unit, such as o-, m- or p-poly(hydroxystyrene) or a copolymer thereof, hydrogenated poly(hydroxystyrene), halogen- or alkyl-substituted poly(hydroxystyrene), partially O-alkylated or O-acylated poly(hydroxystyrene), styrene-hydroxystyrene copolymer, α-methylstyrene-hydroxystyrene copolymer and hydrogenated novolak resin; or an alkali-soluble resin containing a repeating unit having a carboxyl group, such as (meth)acrylic acid and norbornene carboxylic acid.

Preferred examples of the repeating unit having an acid-decomposable group for use in the present invention include tert-butoxycarbonyloxystyrene, 1-alkoxyethoxystyrene and tertiary alkyl (meth)acrylate. Among these, 2-alkyl-2-adamantyl (meth)acrylate and dialkyl(1-adamantyl)methyl (meth)acrylate are more preferred.

The component (B) can be obtained by reacting a precursor of a group capable of decomposing by the effect of an acid with an alkali-soluble resin or by copolymerizing an alkali-soluble resin monomer having bonded thereto a group capable of decomposing by the effect of an acid with various monomers, and this is disclosed in European Patent 254853, JP-A-2-25850, JP-A-3-223860 and JP-A-4-251259.

In the case of irradiating the resist composition of the present invention with KrF excimer laser light, electron beam, X-ray or high-energy light at a wavelength of 50 nm or less (e.g., EUV), the resin as the component (B) prefer- ably has a hydroxystyrene repeating unit, and the resin is more preferably a copolymer of hydroxystyrene/hydroxystyrene protected by an acid-decomposable group, or hydroxystyrene/tertiary alkyl (meth)acrylate.

Specific examples of the component (B) are set forth below, but the present invention is not limited thereto.

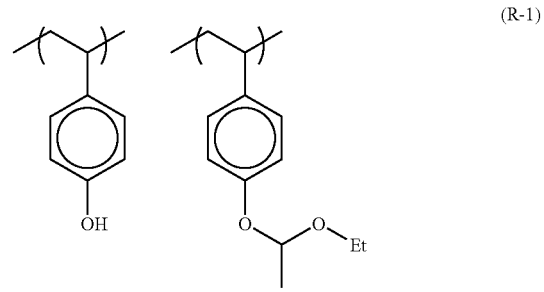

(R-1)

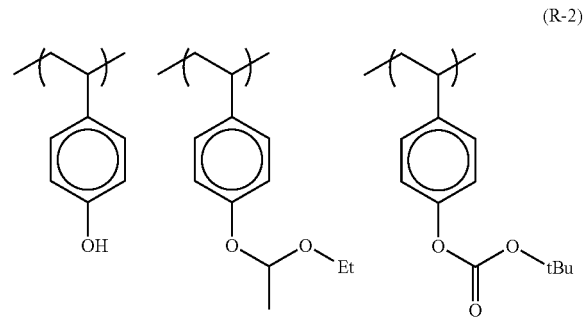

(R-2)

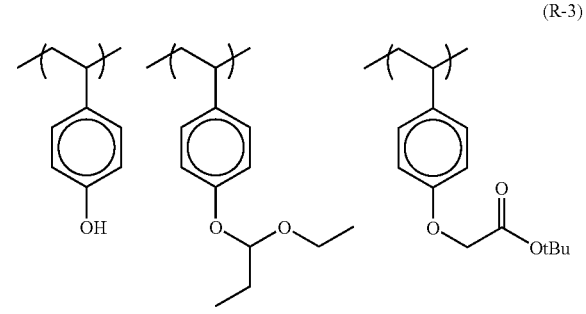

(R-3)

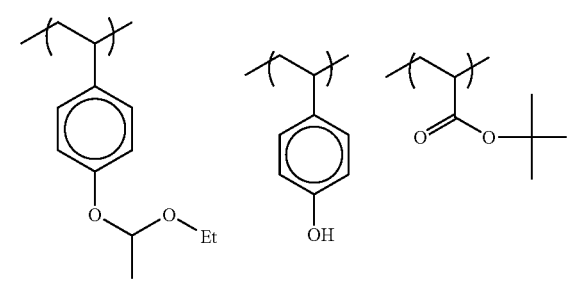

(R-4)

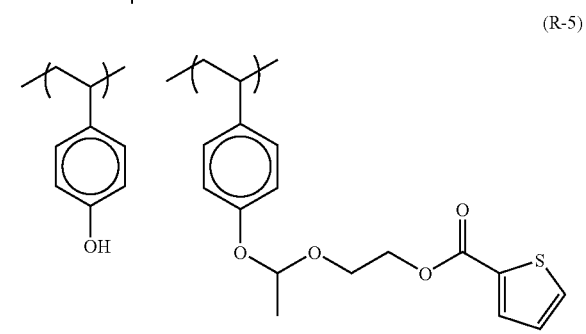

(R-5)

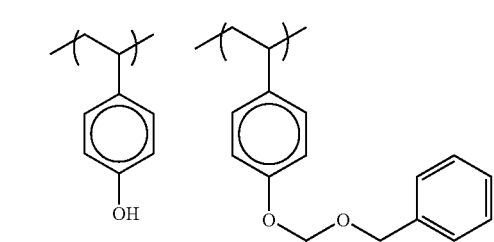
(R-6)
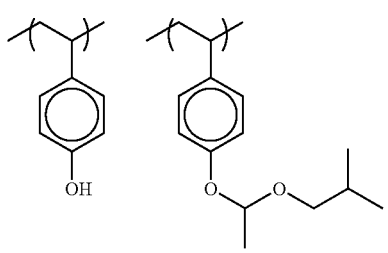
(R-12)
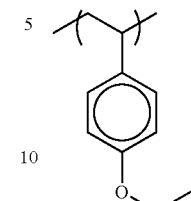
(R-7)
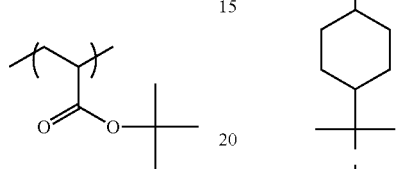
(R-8)
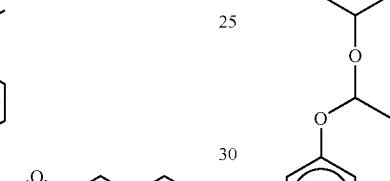
(R-13)
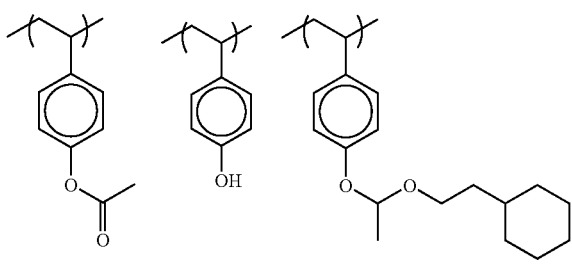
(R-9)
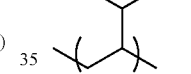
(R-14)
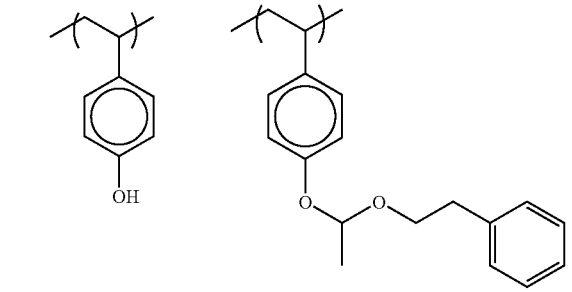
(R-10)
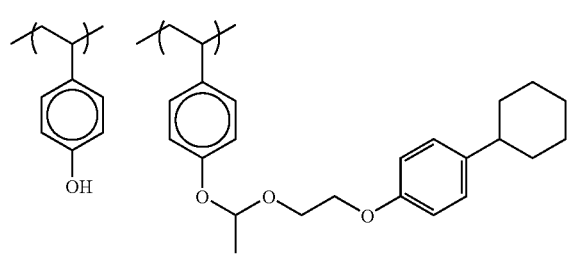
(R-11)
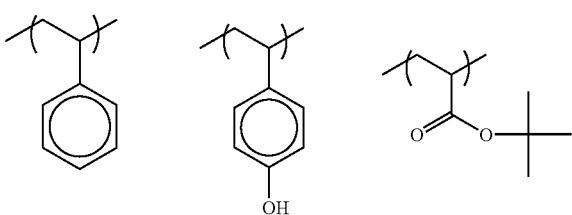
(R-15)

-continued (R-16)

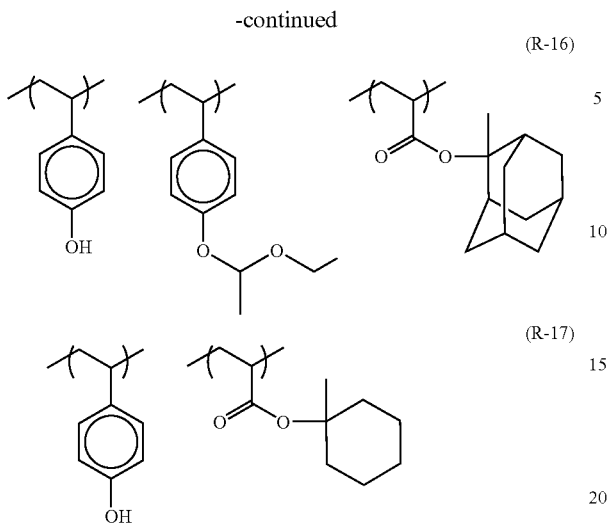

(R-17)

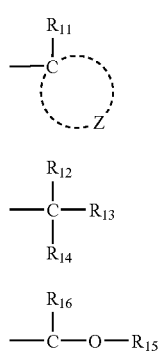

In these specific examples, "tBu" indicates a tert-butyl group.

The content of the acid-decomposable group is expressed by B/(B+S) using the number (B) of acid-decomposable groups in the resin and the number (S) of alkali-soluble groups not protected by a group which splits off by the effect of an acid. The content is preferably from 0.01 to 0.7, more preferably from 0.05 to 0.50, still more preferably from 0.05 to 0.40.

In the case of irradiating the positive resist composition of the present invention with ArF excimer laser light, the resin as the component (B) is preferably a resin having a monocyclic or polycyclic alicyclic hydrocarbon structure and capable of decomposing under the action of an acid to increase the solubility in an alkali developer.

The resin having a monocyclic or polycyclic alicyclic hydrocarbon structure and capable of decomposing under the action of an acid to increase the solubility in an alkali developer (hereinafter sometimes referred to as an "alicyclic hydrocarbon-based acid-decomposable resin") is preferably a resin containing at least one repeating unit selected from the group consisting of a repeating unit having an alicyclic hydrocarbon-containing partial structure represented by any one of the following formulae (pI) to (pV), and a repeating unit represented by the following formula (II-AB):

-continued

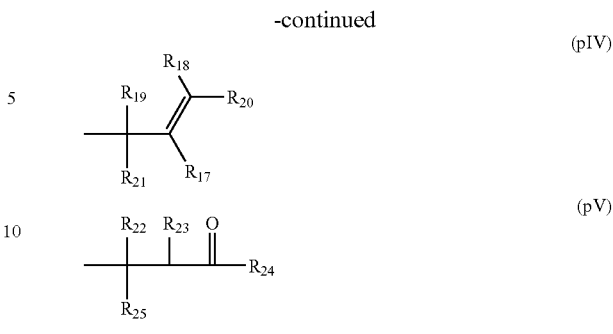

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming a cycloalkyl group together with the carbon atom.

$R_{12}$ to $R_{16}$ each independently represents a linear or branched alkyl group having a carbon number of 1 to 4 or a cycloalkyl group, provided that at least one of $R_{12}$ to $R_{14}$ or either one of $R_{15}$ and $R_{16}$ represents a cycloalkyl group.

$R_{17}$ to $R_{21}$ each independently represents a hydrogen atom a linear or branched alkyl group having a carbon number of 1 to 4, or a cycloalkyl group, provided that at least one of $R_{17}$ to $R_{21}$ represents a cycloalkyl group and that either one of $R_{19}$ and $R_{21}$ represents a linear or branched alkyl group having a carbon number of 1 to 4 or a cycloalkyl group.

$R_{22}$ to $R_{25}$ each independently represents a hydrogen atom, a linear or branched alkyl group having a carbon number of 1 to 4, or a cycloalkyl group, provided that at least one of $R_{22}$ to $R_{25}$ represents a cycloalkyl group. $R_{23}$ and $R_{24}$ may combine with each other to form a ring.

In formula (II-AB), $R_{11}'$ and $R_{12}'$ each independently represents a hydrogen atom, a cyano group, a halogen atom or an alkyl group.

Z' represents an atomic group for forming an alicyclic structure, containing two bonded carbon atoms (C-C).

Formula (II-AB) is preferably the following formula (II-AB1) or (II-AB2):

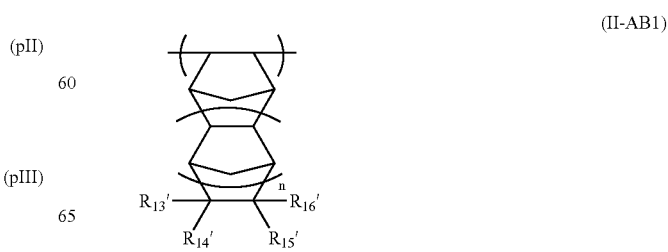

-continued (II-AB2)

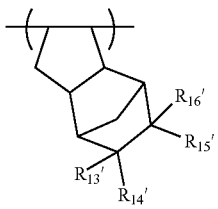

In formulae (II-AB1) and (II-AB2), $R_{13}'$ to $R_{16}'$ each independently represents a hydrogen atom, a halogen atom, a cyano group, a hydroxyl group, —COOH, —COOR$_5$, a group capable of decomposing under the action of an acid, —C(=O)—X-A'-R$_{17}'$, an alkyl group or a cycloalkyl group, and at least two members out of $R_{13}'$ to $R_{16}'$ may combine to form a ring.

$R_5$ represents an alkyl group, a cycloalkyl group or a group having a lactone structure.

X represents an oxygen atom, a sulfur atom, —NH—, —NHSO$_2$— or —NHSO$_2$NH—.

A' represents a sing bond or a divalent linking group.

$R_{17}'$ represents —COOH, —COOR$_5$, —CN, a hydroxyl group, an alkoxy group, —CO—NH—R$_6$, —CO—NH—SO$_2$—R$_6$ or a group having a lactone structure.

$R_6$ represents an alkyl group or a cycloalkyl group.

n represents 0 or 1.

In formulae (pI) to (pV), the alkyl group of $R_{12}$ to $R_{25}$ is a linear or branched alkyl group having from 1 to 4 carbon atoms, and examples thereof include a methyl group, an ethyl group, a propyl group, an n-butyl group, a sec-butyl group and a tert-butyl group.

The cycloalkyl group of $R_{12}$ to $R_{25}$ and the cycloalkyl group formed by Z together with the carbon atom may be monocyclic or polycyclic. Specific examples thereof include a group having a monocyclo, bicyclo, tricyclo or tetracyclo structure or the like with a carbon number of 5 or more. The carbon number thereof is preferably from 6 to 30, more preferably from 7 to 25. These cycloalkyl groups each may have a substituent.

Preferred examples of the cycloalkyl group include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group and a cyclododecanyl group. Among these, more preferred are an adamantyl group, a norbornyl group, a cyclohexyl group, a cyclopentyl group, a tetracyclododecanyl group and a tricyclodecanyl group.

These alkyl and cycloalkyl groups each may further have a substituent. Examples of the substituent which the alkyl and cycloalkyl groups each may further have include an alkyl group (having a carbon number of 1 to 4), a halogen atom, a hydroxyl group, an alkoxy group (having a carbon number of 1 to 4), a carboxyl group and an alkoxycarbonyl group (having a carbon number of 2 to 6). These alkyl, alkoxy and alkoxycarbonyl groups and the like each may further have a substituent. Examples of the substituent which the alkyl, alkoxy and alkoxycarbonyl groups and the like each may further have include a hydroxyl group, a halogen atom and an alkoxy group.

The structures represented by formulae (pI) to (pV) each can be used for the protection of an alkali-soluble group in the resin. The alkali-soluble group includes various groups known in this technical field.

Specific examples of the repeating unit where an alkali-soluble group is protected include structures where the hydrogen atom of a carboxylic acid group, sulfonic acid group, phenol group or thiol group is replaced by the structure represented by any one of formulae (pI) to (pV). Among these, preferred are structures where the hydrogen atom of a carboxylic acid group or sulfonic acid group is replaced by the structure represented by any one of formulae (pI) to (pV).

The repeating unit having an alkali-soluble group protected by the structure represented by any one of formulae (pI) to (pV) is preferably a repeating unit represented by the following formula (pA):

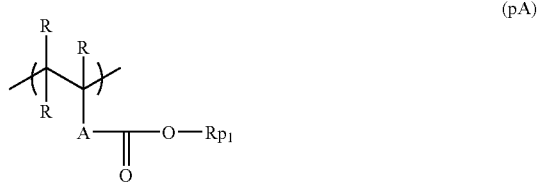

(pA)

In formula (pA), R represents a hydrogen atom, a halogen atom or a linear or branched alkyl group having from 1 to 4 carbon atoms, and the plurality of R's may be the same or different.

A represents a single bond, or one or a combination of two or more groups selected from the group consisting of an alkylene group, an ether group, a thioether group, a carbonyl group, an ester group, an amido group, a sulfonamido group, a urethane group and a urea group. A is preferably a single bond.

Rp$_1$ represents any one group of formulae (pI) to (pV).

The repeating unit represented by formula (pA) is most preferably a repeating unit comprising a 2-alkyl-2-adamantyl (meth)acrylate or a dialkyl(1-adamantyl)methyl (meth) acrylate.

Specific examples of the repeating unit represented by formula (pA) are set forth below.

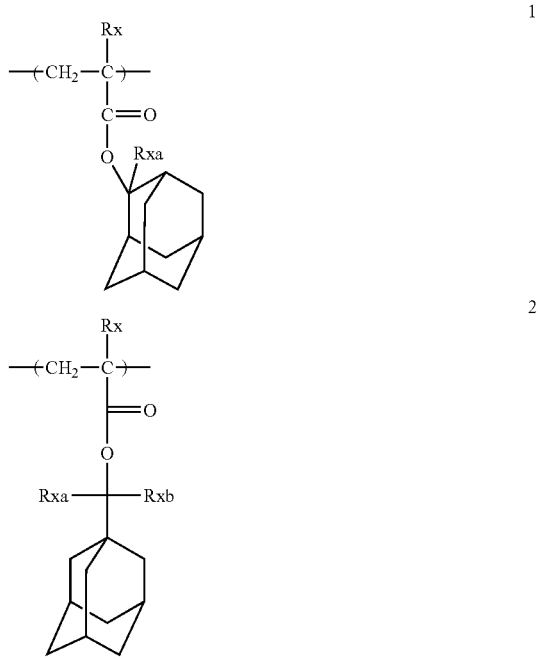

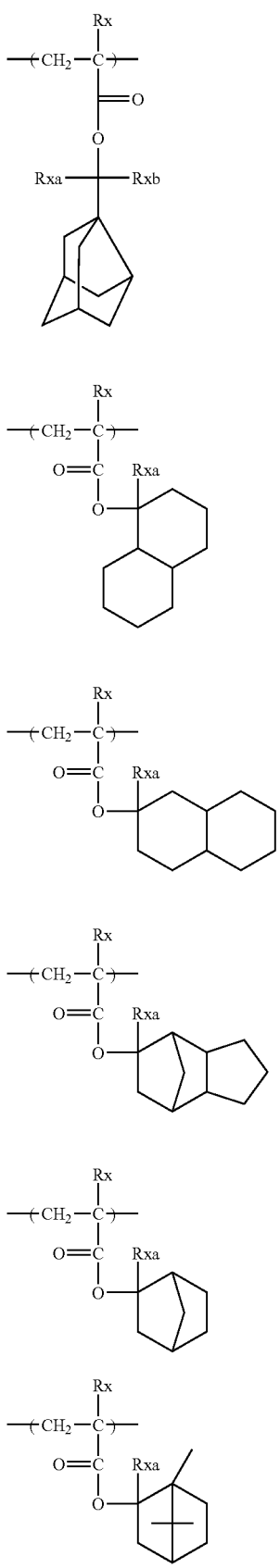
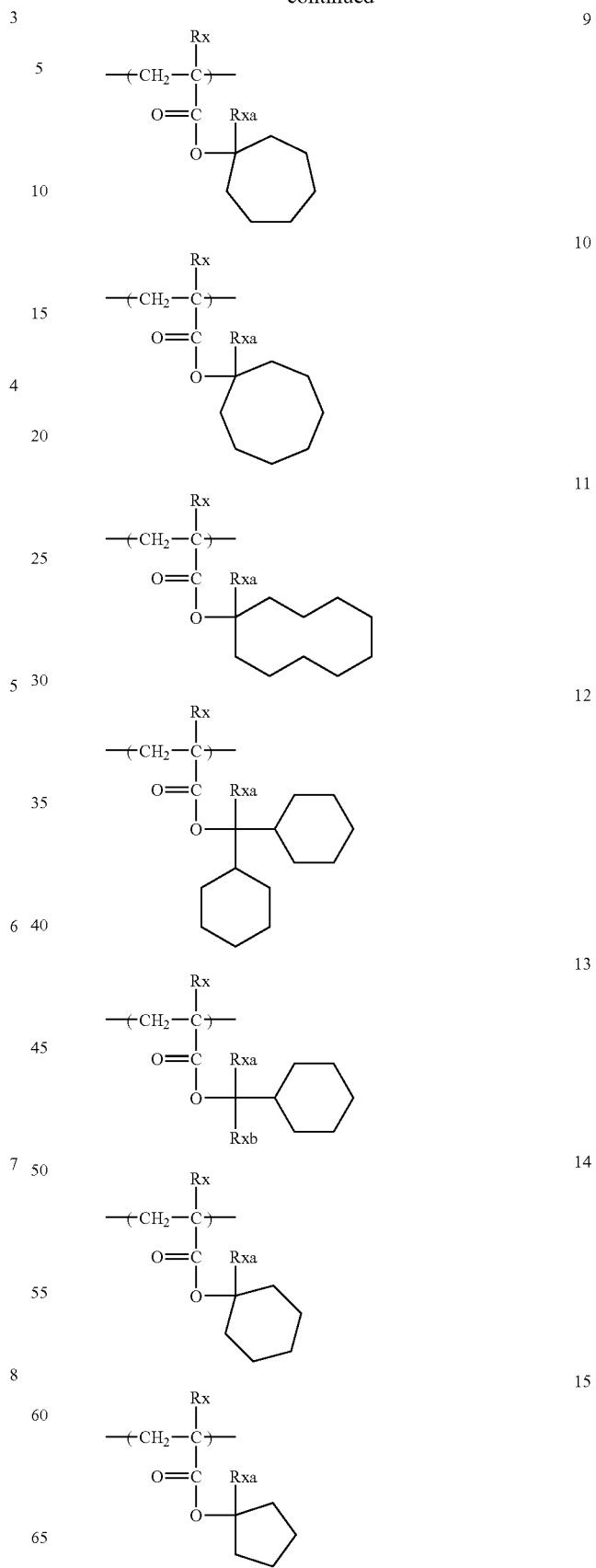

-continued

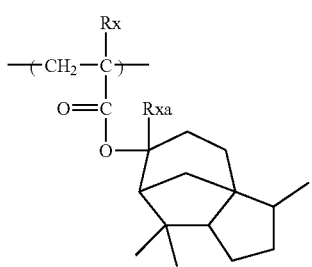

16

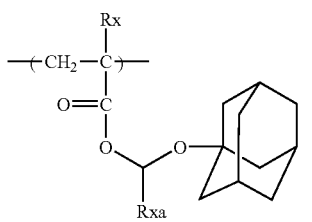

17

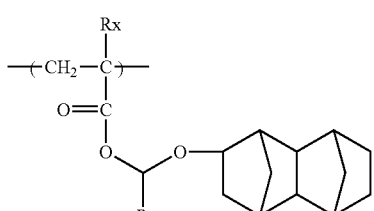

18

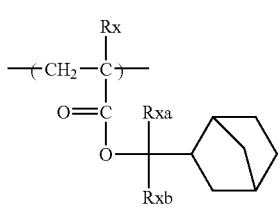

19

In the structural formulae above, Rx represents H, $CH_3$, $CF_3$ or $CH_2OH$, and Rxa and Rxb each independently represents an alkyl group having a carbon number of 1 to 4.

Examples of the halogen atom of $R_{11}'$ and $R_{12}'$ in formula (II-AB) include a chlorine atom, a bromine atom, a fluorine atom and an iodine atom.

The alkyl group of $R_{11}'$ and $R_{12}'$ is preferably a linear or branched alkyl group having a carbon number of 1 to 10, and examples thereof include a methyl group, an ethyl group, an n-propyl group, an isopropyl group and a linear or branched butyl, pentyl, hexyl or heptyl group.

The atomic group of Z' for forming an alicyclic structure is an atomic group for forming, in the resin, an alicyclic hydrocarbon repeating unit which may have a substituent. In particular, an atomic group for forming a crosslinked alicyclic structure to form a crosslinked alicyclic hydrocarbon repeating unit is preferred.

Examples of the skeleton of the alicyclic hydrocarbon formed are the same as those of the cycloalkyl group of $R_{12}$ to $R_{25}$ in formulae (pI) to (pVI).

The alicyclic hydrocarbon skeleton may have a substituent, and examples of the substituent include $R_{13}'$ to $R_{16}'$ in formulae (II-AB1) and (II-AB2).

In the alicyclic hydrocarbon-based acid-decomposable resin, the acid-decomposable group may be contained in at least one repeating unit out of the repeating unit having an alicyclic hydrocarbon-containing partial structure represented by any one of formulae (pI) to (pV), the repeating unit represented by formula (II-AB), and the repeating unit comprising a copolymerization component described later.

Various substituents $R_{13}'$ to $R_{16}'$ in formulae (II-AB1) and (II-AB2) may work out to a substituent of the atomic group for forming an alicyclic structure in formula (II-AB) or the atomic group Z for forming a crosslinked alicyclic structure.

Specific examples of the repeating units represented by formulae (II-AB1) and (II-AB2) are set forth below, but the present invention is not limited thereto.

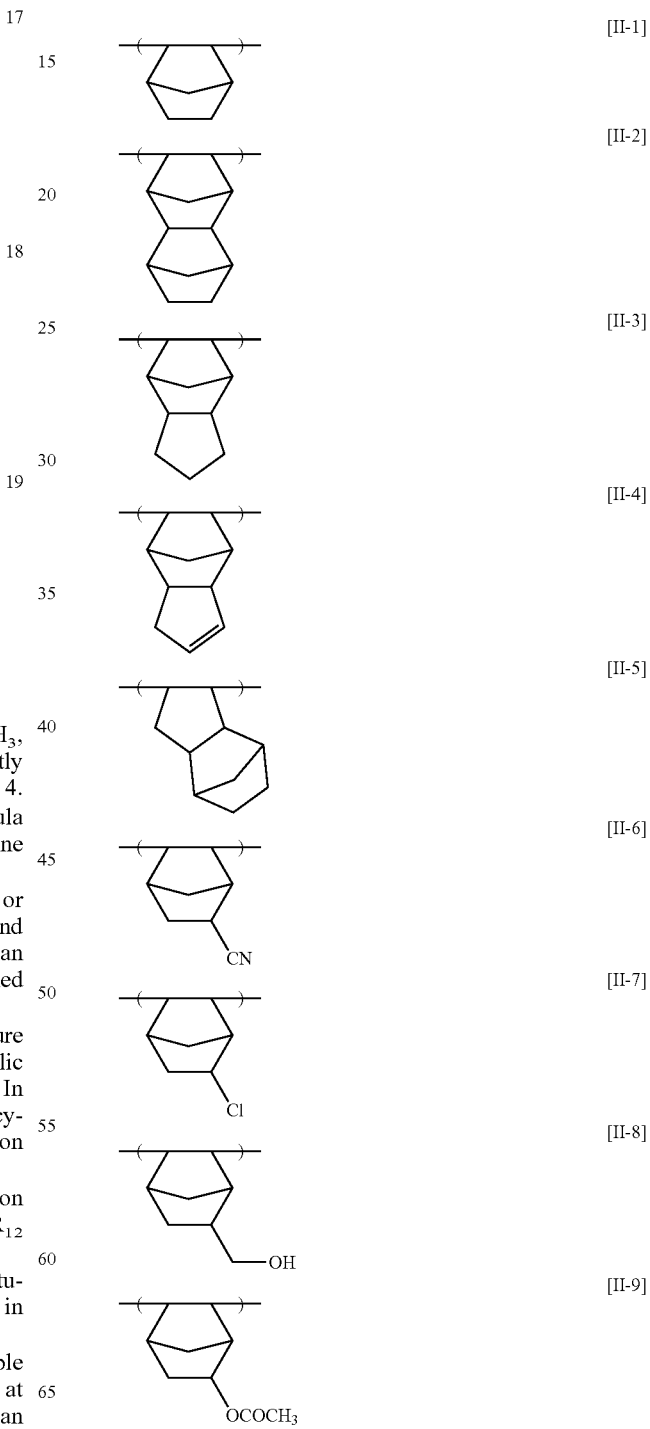

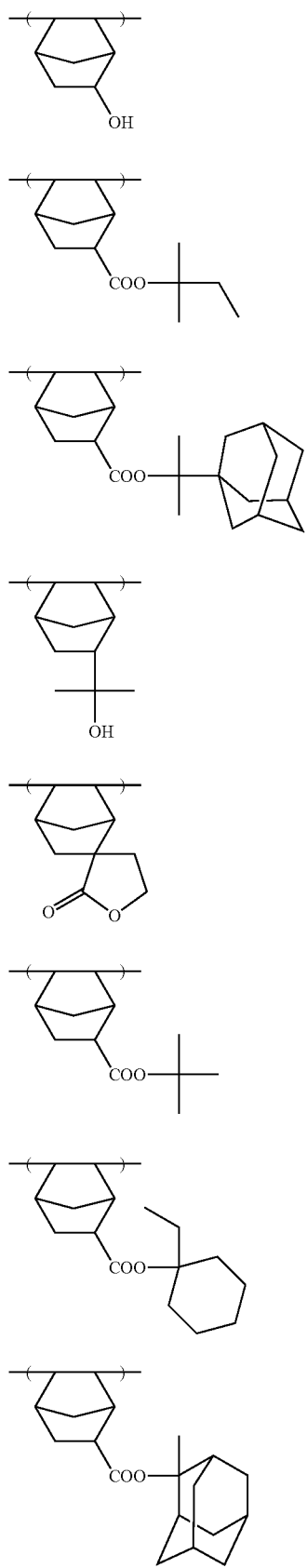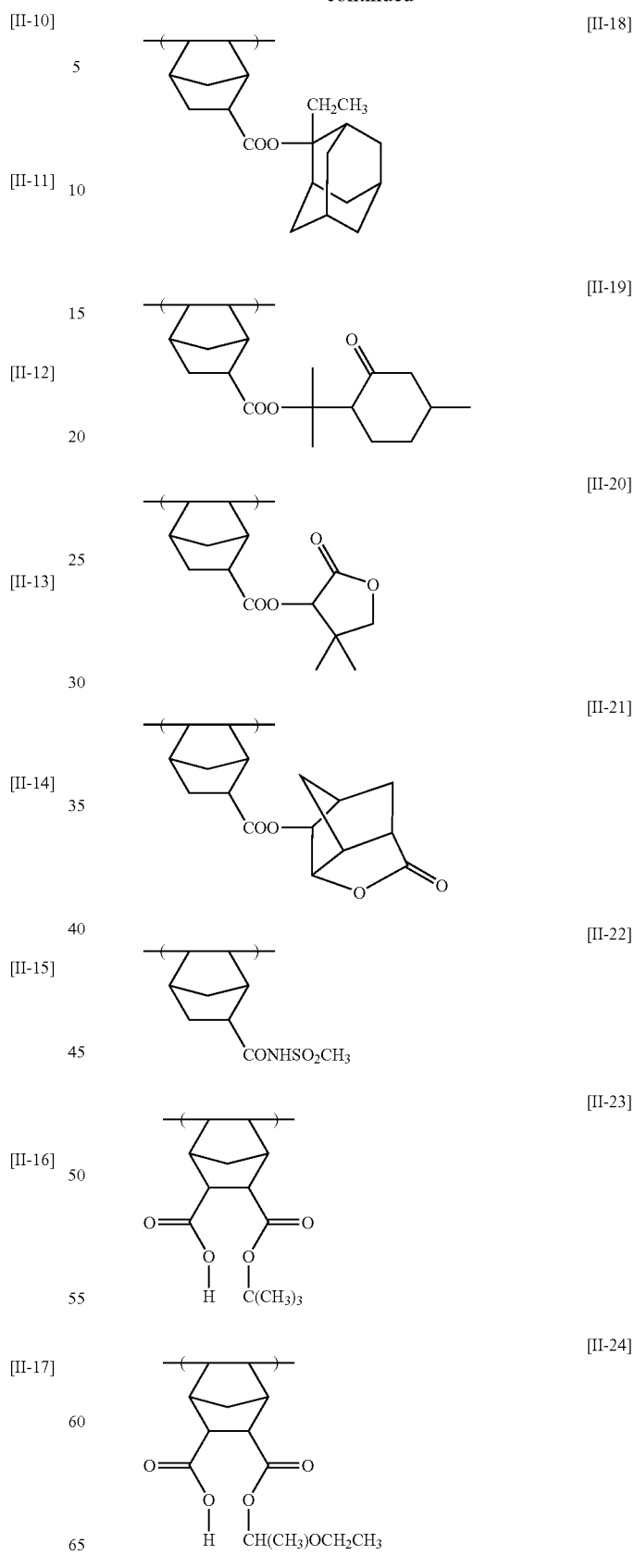

-continued

[II-25]
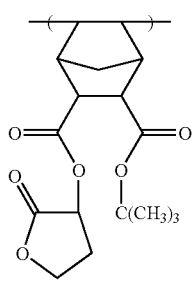

[II-26]
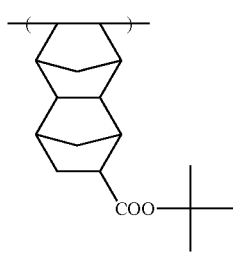

[II-27]
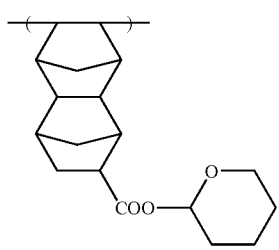

[II-28]
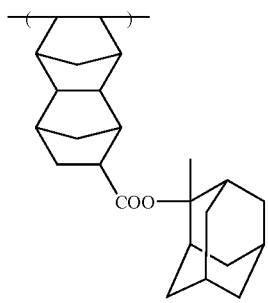

[II-29]
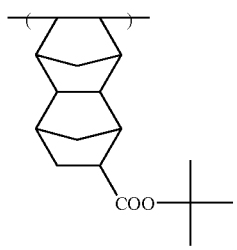

[II-30]
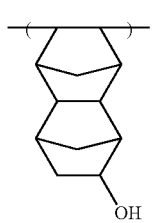

-continued

[II-31]
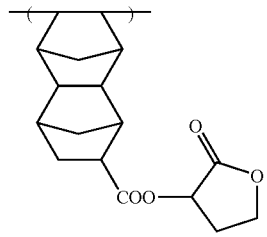

[II-32]
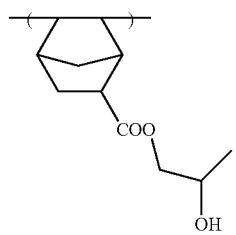

The alicyclic hydrocarbon-based acid-decomposable resin preferably contains a repeating unit having a lactone group. As for the lactone group, any group may be used as long as it has a lactone structure, but a group having a 5-, 6- or 7-membered ring lactone structure is preferred. The 5-, 6- or 7-membered ring lactone structure is preferably condensed with another ring structure in the form of forming a bicyclo or spiro structure. The alicyclic hydrocarbon-based acid-decomposable resin for use in the present invention more preferably has a repeating unit containing a group having a lactone structure represented by any one of the following formulae (LC1-1) to (LC1-16). The group having a lactone structure may be bonded directly to the main chain. Among these lactone structures, (LC1-1), (LC1-4), (LC1-5), (LC1-6), (LC1-13) and (LC1-14) are preferred. By virtue of using a specific lactone structure, the line edge roughness and development defect are improved.

LC1-1
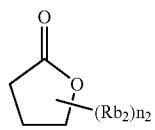

LC1-2
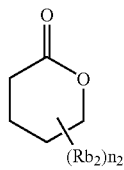

LC1-3
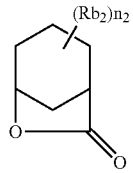

-continued

LC1-4
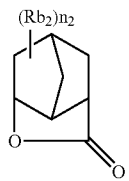

LC1-5
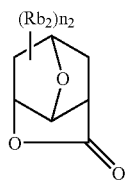

LC1-6
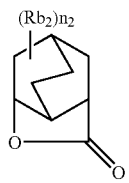

LC1-7
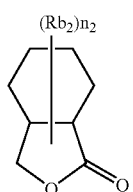

LC1-8
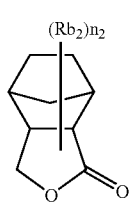

LC1-9
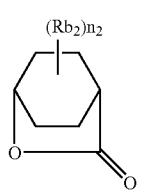

LC1-10
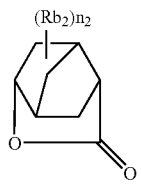

LC1-11
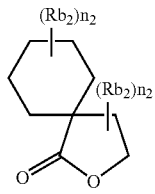

-continued

LC1-12
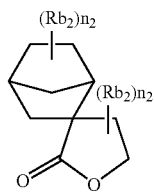

LC1-13
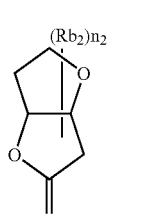

LC1-14
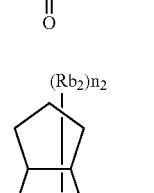

LC1-15
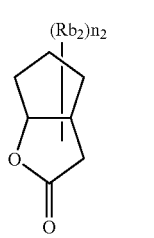

LC1-16
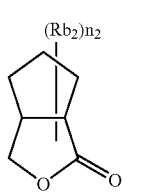

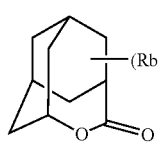

The lactone structure moiety may or may not have a substituent ($Rb_2$). Preferred examples of the substituent ($Rb_2$) include an alkyl group having a carbon number of 1 to 8, a cycloalkyl group having a carbon number of 4 to 7, an alkoxy group having a carbon number of 1 to 8, an alkoxycarbonyl group having a carbon number of 1 to 8, a carboxyl group, a halogen atom, a hydroxyl group, a cyano group and an acid-decomposable group. $n_2$ represents an integer of 0 to 4. When $n_2$ is an integer of 2 or more, the plurality of $Rb_2$'s may be the same or different and also, the plurality of $Rb_2$'s may combine with each other to form a ring.

Examples of the repeating unit containing a group having a lactone structure represented by any one of formulae (LC1-1) to (LC1-16) include a repeating unit where at least one of $R_{13}'$ to $R_{16}'$ in formula (II-AB 1) or (II-AB2) has a group represented by any one of formulae (LC1-1) to (LC1-16) (for example, $R_5$ of —$COOR_5$ is a group represented by any one of formulae (LC1-1) to (LC1-16)), and a repeating unit represented by the following formula (AI):

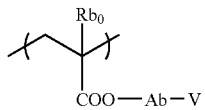
(AI)

In formula (AI), $Rb_0$ represents a hydrogen atom, a halogen atom or an alkyl group having a carbon number of 1 to 4.

Examples of the alkyl group of $Rb_0$ include a methyl group, an ethyl group, a propyl group, an n-butyl group, a sec-butyl group and a tert-butyl group. The alkyl group of $Rb_0$ may have a substituent. Preferred examples of the substituent which the alkyl group of $Rb_0$ may have include a hydroxyl group and a halogen atom.

Examples of the halogen atom of $Rb_0$ include a fluorine atom, a chlorine atom, a bromine atom and an iodine atom. $Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, a carboxyl group, or a divalent group comprising a combination thereof, preferably a single bond or a linking group represented by $-Ab_1-CO_2-$.

$Ab_1$ is a linear or branched alkylene group or a monocyclic or polycyclic cycloalkylene group, preferably a methylene group, an ethylene group, a cyclohexyl residue, an adamantyl residue or a norbornyl residue.

V represents a group represented by any one of formulae (LC1-1) to (LC1-16).

The repeating unit having a lactone structure usually has an optical isomer, but any optical isomer may be used. One optical isomer may be used alone or a mixture of a plurality of optical isomers may be used. In the case of mainly using one optical isomer, the optical purity (ee) thereof is preferably 90 or more, more preferably 95 or more.

Specific examples of the repeating unit containing a group having a lactone structure are set forth below, but the present invention is not limited thereto.

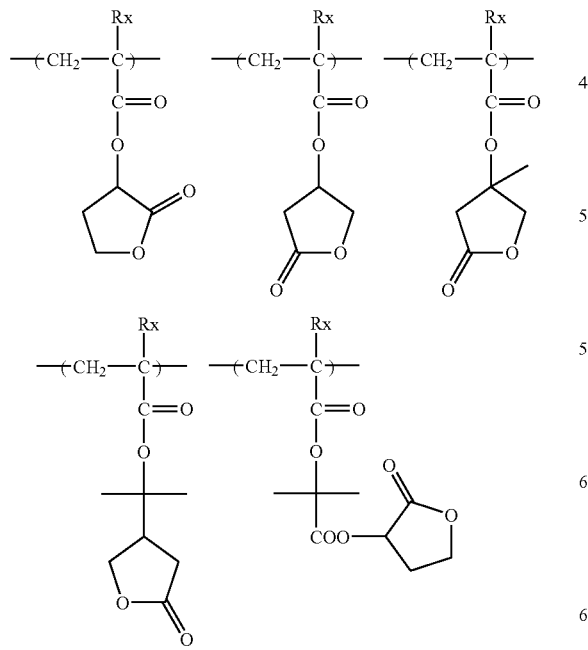

-continued

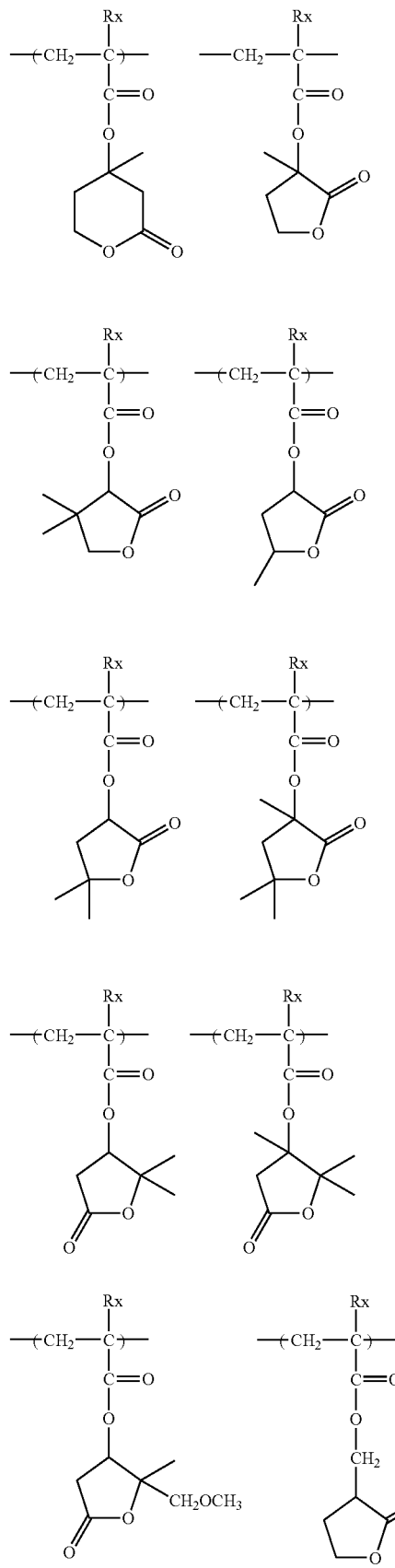

-continued
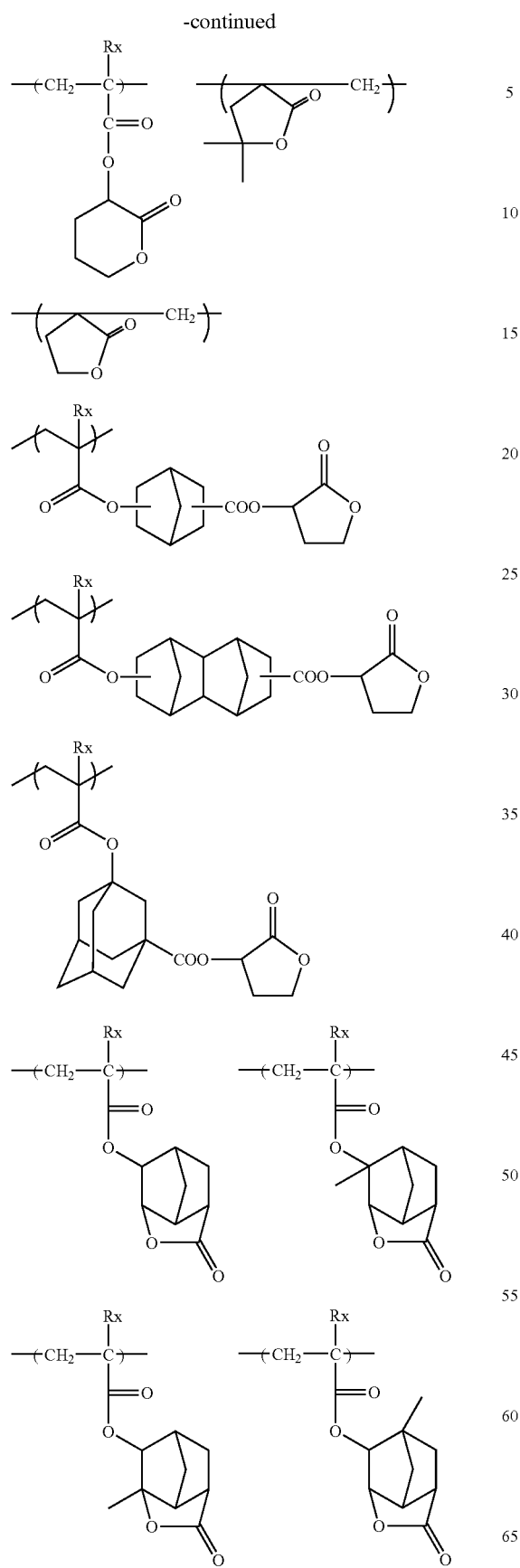
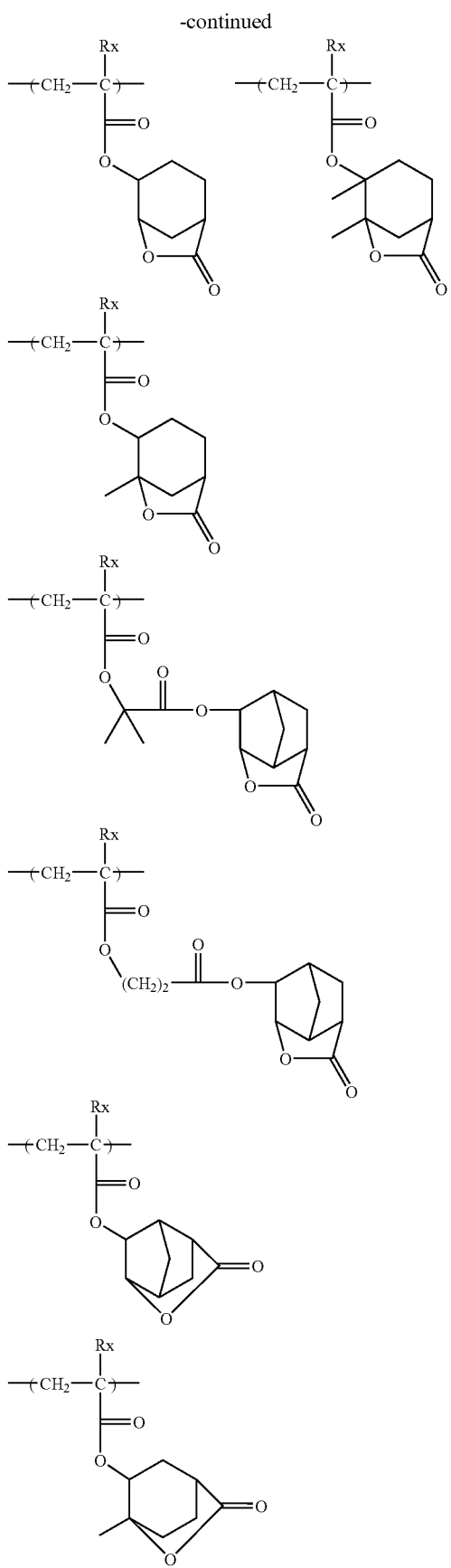

-continued
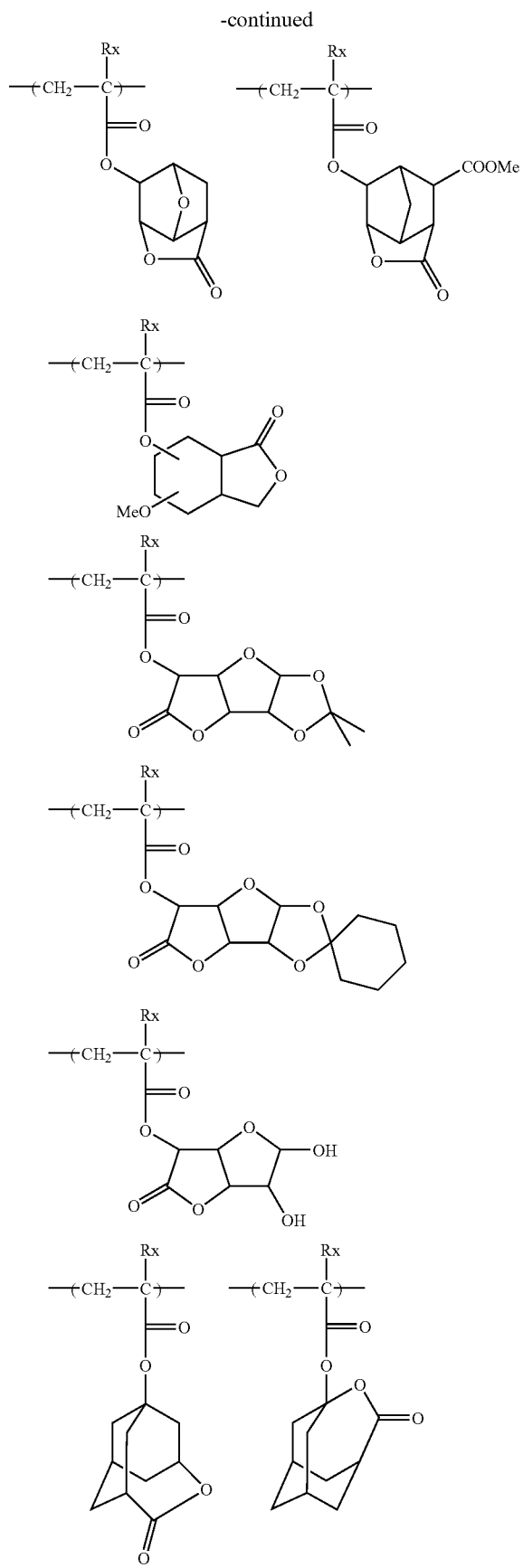
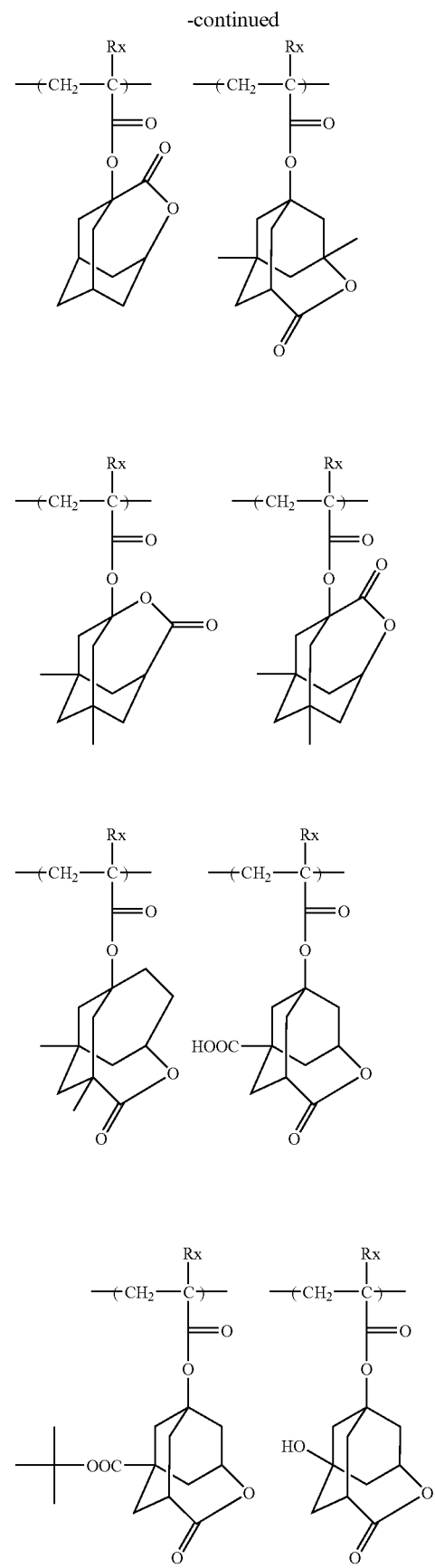

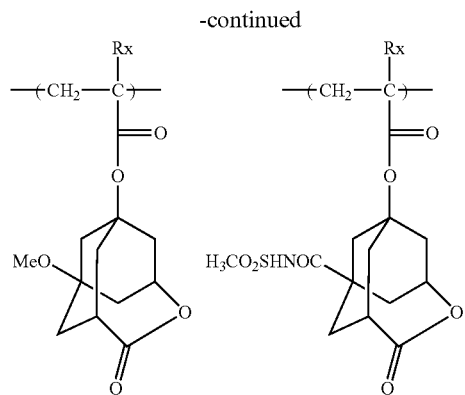

(In formulae, Rx is H, CH₃, CH₂OH or CF₃.)

The alicyclic hydrocarbon-based acid-decomposable resin preferably contains a repeating unit having an alicyclic hydrocarbon structure substituted by a polar group. By virtue of this repeating unit, the adhesion to substrate and the affinity for developer are enhanced. The polar group is preferably a hydroxyl group or a cyano group.

Examples of the alicyclic hydrocarbon structure substituted by a polar group include structures represented by the following formulae (VIIa) and (VIIb):

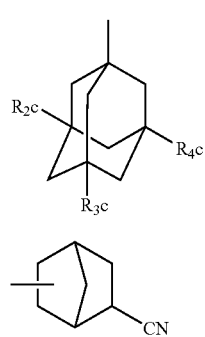

In formula (VIIa), $R_{2c}$ to $R_{4c}$ each independently represents a hydrogen atom, a hydroxyl group or a cyano group, provided that at least one of $R_{2c}$ to $R_{4c}$ represents a hydroxyl group or a cyano group. A structure where one or two member out of $R_{2c}$ to $R_{4c}$ is a hydroxyl group with the remaining being a hydrogen atom is preferred, and a structure where two members out of $R_{2c}$ to $R_{4c}$ are a hydroxyl group with the remaining being a hydrogen atom is more preferred.

The group represented by formula (VIIa) is preferably a dihydroxy form or a monohydroxy form, more preferably a dihydroxy form.

Examples of the repeating unit having a group represented by formula (VIIa) or (VIIb) include a repeating unit where at least one of $R_{13}'$ to $R_{16}'$ in formula (II-AB1) or (II-AB2) has a group represented by formula (VIIa) or (VIIb) (for example, $R_5$ of —COOR₅ is a group represented by formula (VIIa) or (VIIb)), and repeating units represented by the following formulae (AIa) and (AIIb):

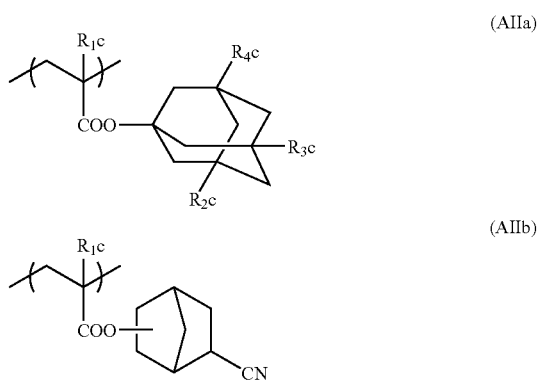

In formulae (AIIa) and (AIIb), $R_{1c}$ represents a hydrogen atom, a methyl group, a trifluoromethyl group or a hydroxymethyl group.

$R_{2c}$ to $R_{4c}$ have the same meanings as $R_{2c}$ to $R_{4c}$ in formula (VIIa).

Specific examples of the repeating units represented by formulae (AIIa) and (AIIb) having an alicyclic hydrocarbon structure substituted by a polar group are set forth below, but the present invention is not limited thereto.

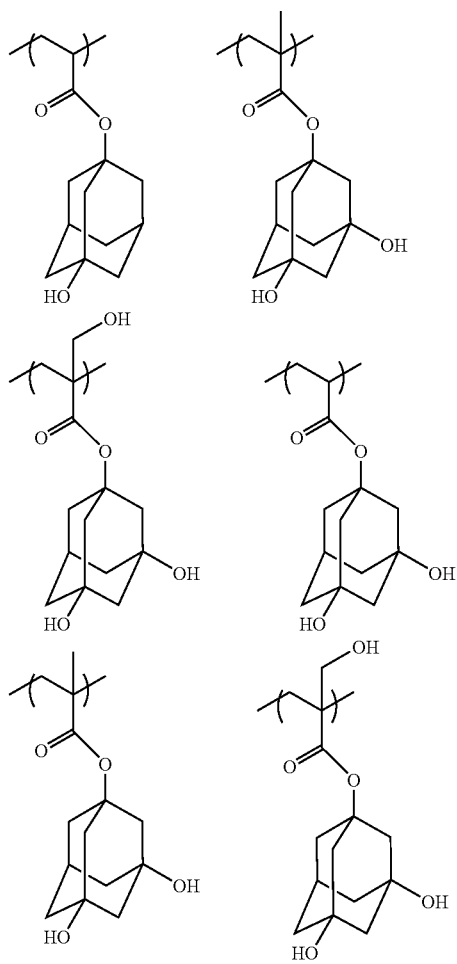

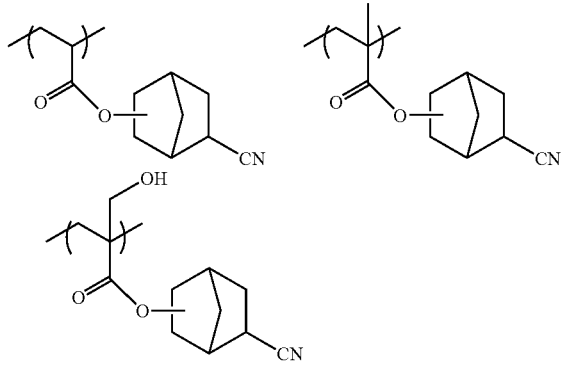

The alicyclic hydrocarbon-based acid-decomposable resin may contain a repeating unit represented by the following formula (VIII):

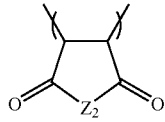

(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$. $R_{42}$ represents an alkyl group, a cycloalkyl group or a camphor residue. The alkyl group of $R_{41}$ and $R_{42}$ may be substituted by a halogen atom (preferably fluorine atom) or the like.

Specific examples of the repeating unit represented by formula (VIII) are set forth below, but the present invention is not limited thereto.

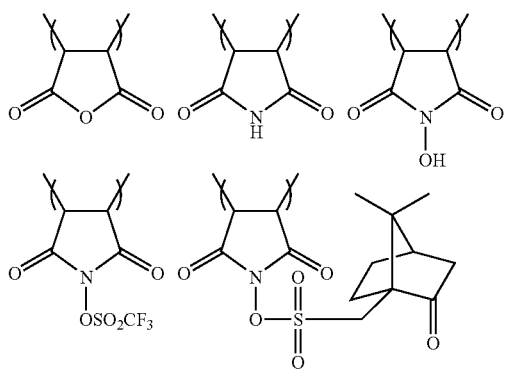

The alicyclic hydrocarbon-based acid-decomposable resin preferably contains a repeating unit having an alkali-soluble group, more preferably a repeating unit having a carboxyl group. By virtue of containing such a repeating unit, the resolution increases in usage of forming contact holes. As for the repeating unit having a carboxyl group, both a repeating unit where a carboxyl group is directly bonded to the resin main chain, such as repeating unit by an acrylic acid or a methacrylic acid, and a repeating unit where a carboxyl group is bonded to the resin main chain through a linking group, are preferred. The linking group may have a monocyclic or polycyclic hydrocarbon structure. An acrylic acid and a methacrylic acid are most preferred.

The alicyclic hydrocarbon-based acid-decomposable resin may contain a repeating unit having from 1 to 3 groups represented by the following formula (F1). By virtue of this repeating unit, the line edge roughness performance is enhanced.

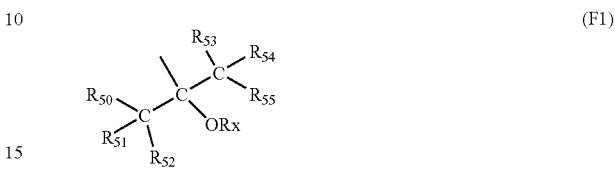

(F1)

In formula (F1), $R_{50}$ to $R_{55}$ each independently represents a hydrogen atom, a fluorine atom or an alkyl group, provided that at least one of $R_{50}$ to $R_{55}$ is a fluorine atom or an alkyl group with at least one hydrogen atom being substituted by a fluorine atom.

Rx represents a hydrogen atom or an organic group (preferably an acid-decomposable protective group, an alkyl group, a cycloalkyl group, an acyl group or an alkoxycarbonyl group).

The alkyl group of $R_{50}$ to $R_{55}$ may be substituted by a halogen atom (e.g., fluorine), a cyano group or the like. The alkyl group is preferably an alkyl group having a carbon number of 1 to 3, and examples thereof include a methyl group and a trifluoromethyl group.

It is preferred that $R_{50}$ to $R_{55}$ all are a fluorine atom.

The organic group represented by Rx is preferably an acid-decomposable protective group or an alkyl, cycloalkyl, acyl, alkylcarbonyl, alkoxycarbonyl, alkoxycarbonylmethyl, alkoxymethyl or 1-alkoxyethyl group which may have a substituent.

The repeating unit having a group represented by formula (F1) is preferably a repeating unit represented by the following formula (F2):

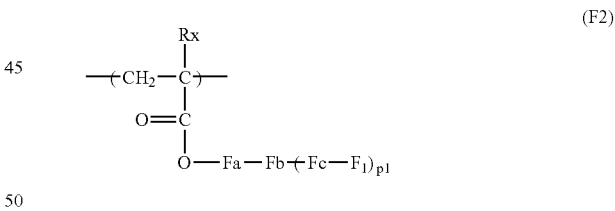

(F2)

In formula (F2), Rx represents a hydrogen atom, a halogen atom or an alkyl group having a carbon number of 1 to 4. Preferred examples of the substituent which the alkyl group of Rx may have include a hydroxyl group and a halogen atom.

Fa represents a single bond or a linear or branched alkylene group, preferably a single bond.

Fb represents a monocyclic or polycyclic hydrocarbon group.

Fc represents a single bond or a linear or branched alkylene group, preferably a single bond or a methylene group.

$F_1$ represents a group represented by formula (F1).

$p_1$ represents an integer of 1 to 3.

The cyclic hydrocarbon group in Fb is preferably a cyclopentyl group, a cyclohexyl group or a norbornyl group.

Specific examples of the repeating unit having a group represented formula (F1) are set forth below.

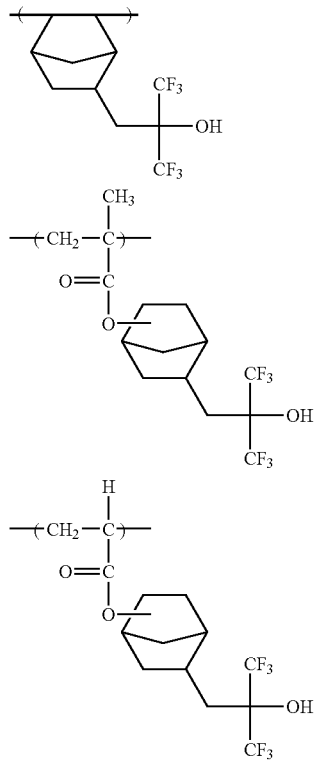

The alicyclic hydrocarbon-based acid-decomposable resin may contain, in addition to the above-described repeating structural units, various repeating structural units for the purpose of controlling the dry etching resistance, suitability for standard developer, adhesion to substrate, resist profile and properties generally required of the resist, such as resolving power, heat resistance and sensitivity.

Examples of such a repeating structural unit include, but are not limited to, repeating structural units corresponding to the monomers described below.

By virtue of such a repeating structural unit, the performance required of the alicyclic hydrocarbon-based acid-decomposable resin, particularly, (1) solubility in the coating solvent,
(2) film-forming property (glass transition point),
(3) alkali developability,
(4) film loss (selection of hydrophilic, hydrophobic or alkali-soluble group),
(5) adhesion of unexposed area to substrate,
(6) dry etching resistance and the like, can be subtly controlled.

Examples of the monomer include a compound having one addition-polymerizable unsaturated bond selected from acrylic acid esters, methacrylic acid esters, acrylamides, methacrylamides, allyl compounds, vinyl ethers and vinyl esters.

Other than these, an addition-polymerizable unsaturated compound copolymerizable with the monomer corresponding to the above-described various repeating structural units may be copolymerized.

In the alicyclic hydrocarbon-based acid-decomposable resin, the molar ratio of respective repeating structural units contained is appropriately selected to control the dry etching resistance of resist, suitability for standard developer, adhesion to substrate, resist profile and performances generally required of the resist, such as resolving power, heat resistance and sensitivity.

The preferred embodiment of the alicyclic hydrocarbon-based acid-decomposable resin includes the followings:

(1) a resin containing a repeating unit having an alicyclic hydrocarbon-containing partial structure represented by any one of formulae (pI) to (pV) (side chain type), preferably containing a (meth)acrylate repeating unit having a structure represented by any one of formulae (pI) to (pV), and (2) a resin containing a repeating unit represented by formula (II-AB) (main chain type).

The embodiment of (2) further includes:

(3) a resin having a repeating unit represented by formula (II-AB), a maleic anhydride derivative structure and a (meth)acrylate structure (hybrid type).

In the alicyclic hydrocarbon-based acid-decomposable resin, the content of the repeating unit having an acid-decomposable group is preferably from 10 to 60 mol %, more preferably from 20 to 50 mol %, still more preferably from 25 to 40 mol %, based on all repeating structural units.

In the alicyclic hydrocarbon-based acid-decomposable resin, the content of the repeating unit having an alicyclic hydrocarbon-containing partial structure represented by any one of formulae (pI) to (pV) is preferably from 25 to 70 mol %, more preferably from 35 to 65 mol %, still more preferably from 40 to 60 mol %, based on all repeating structural units.

In the alicyclic hydrocarbon-based acid-decomposable resin, the content of the repeating unit represented by formula (II-AB) is preferably from 10 to 60 mol %, more preferably from 15 to 55 mol %, still more preferably from 20 to 50 mol %, based on all repeating structural units.

The content of the repeating structural unit based on the monomer as the further copolymerization component, in the resin, can also be appropriately selected according to the desired resist performance but generally, the content thereof is preferably 99 mol % or less, more preferably 90 mol % or less, still more preferably 80 mol % or less, based on the total molar number of the repeating structural unit having an alicyclic hydrocarbon-containing partial structure represented by any one of formulae (pI) to (pV) and the repeating unit represented by formula (II-AB).

When the resist composition of the present invention is used for exposure with ArF, the resin preferably has no aromatic group in view of transparency to ArF light.

The alicyclic hydrocarbon-based acid-decomposable resin for use in the present invention is preferably a resin where all repeating units are composed of a (meth)acrylate repeating unit. In this case, the repeating units may be all a methacrylate, all an acrylate, or a mixture of methacrylate/acrylate, but the content of the acrylate repeating unit is preferably 50 mol % or less based on all repeating units.

The alicyclic hydrocarbon-based acid-decomposable resin for use in the present invention is more preferably a ternary copolymerization polymer comprising from 25 to 50% of the repeating unit having an alicyclic hydrocarbon-containing partial structure represented by any one of formulae (pI) to (pV), from 25 to 50% of the repeating unit having a lactone structure and from 5 to 30% of the repeating unit having an alicyclic hydrocarbon structure substituted by a polar group, or a quaternary copolymerization polymer additionally comprising from 5 to 20% of the repeating unit having a carboxyl group or a structure represented by formula (F1).

The alicyclic hydrocarbon-based acid-decomposable resin for use in the present invention can be synthesized by an ordinary method (for example, radical polymerization). Examples of the synthesis method in general include a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. Examples of the reaction solvent include tetrahydrofuran, 1,4-dioxane, ethers (e.g., diisopropyl ether), ketones (e.g., methyl ethyl ketone, methyl isobutyl ketone), an ester solvent (e.g., ethyl acetate), an amide solvent (e.g., dimethylformamide, diethylacetamide), and a solvent capable of dissolving the composition of the present invention, which is described later, such as propylene glycol monomethyl ether acetate, propylene glycol monomethyl ether and cyclohexanone. The polymerization is preferably performed by using the same solvent as the solvent used in the resist composition of the present invention. By the use of this solvent, generation of particles during storage can be suppressed.

The polymerization reaction is preferably performed in an inert gas atmosphere such as nitrogen and argon. As for the polymerization initiator, the polymerization is started by using a commercially available radical initiator (e.g., azo-based initiator, peroxide). The radical initiator is preferably an azo-based initiator, and an azo-based initiator having an ester group, a cyano group or a carboxyl group is preferred. Preferred examples of the initiator include azobisisobutyronitrile, azobisdimethylvaleronitrile and dimethyl 2,2'-azobis(2-methyl-propionate). The initiator is added additionally or in parts, if desired. After the completion of reaction, the reactant is charged into a solvent, and the desired polymer is recovered by a method such as powder or solid recovery. The reaction concentration is from 5 to 50 mass %, preferably from 10 to 30 mass %, and the reaction temperature is usually from 10 to 150° C., preferably from 30 to 120° C., more preferably from 50 to 100° C.

In the case of using the composition of the present invention for the upper layer resist of a multilayer resist, the resin of the component (B) preferably has a silicon atom.

As for the resin having a silicon atom and capable of decomposing under the action of an acid to increase the solubility in an alkali developer, a resin having a silicon atom at least in either main chain or side chain can be used. Examples of the resin having a siloxane structure in the side chain of resin include a copolymer of an olefin-based monomer having a silicon atom in the side chain, and a (meth)acrylic acid-based monomer having a maleic anhydride and an acid-decomposable group in the side chain.

The resin having a silicon atom is preferably a resin having a trialkylsilyl structure or a monocyclic or polycyclic siloxane structure, more preferably a resin containing a repeating unit having a structure represented by any one of the following formulae (SS-1) to (SS-4), still more preferably a resin containing a (meth)acrylic acid ester-based, vinyl-based or acryl-based repeating unit having a structure represented by any one of formulae (SS-1) to (SS-4).

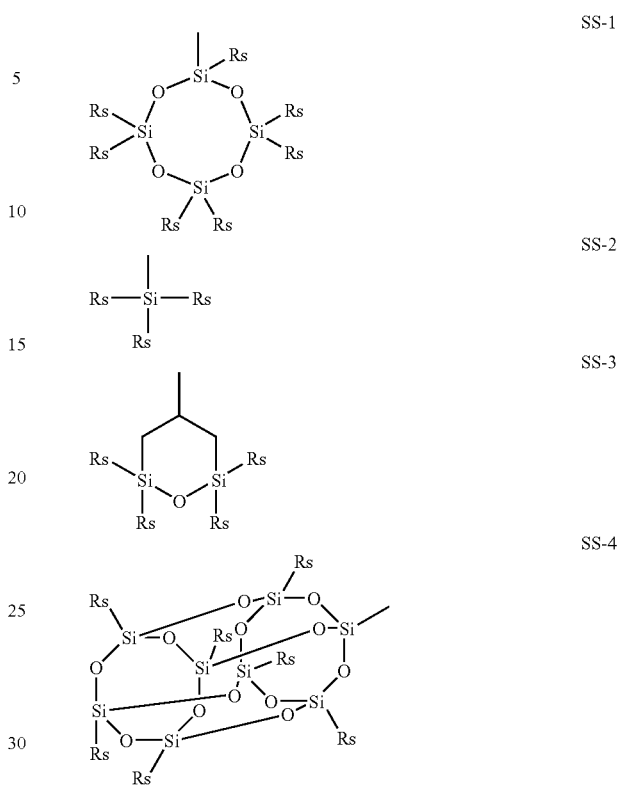

In formulae (SS-1) to (SS-4), Rs represents an alkyl group having a carbon number of 1 to 5 and is preferably a methyl group or an ethyl group.

The resin having a silicon atom is preferably a resin containing two or more different repeating units having a silicon atom, more preferably a resin containing both (Sa) a repeating unit having from 1 to 4 silicon atoms and (Sb) a repeating unit having from 5 to 10 silicon atoms, still more preferably a resin containing at least one repeating unit having a structure represented by any one of formulae (SS-1) to (SS-3) and a repeating unit having a structure represented by formula (SS-4).

In the case of irradiating the resist composition of the present invention with $F_2$ excimer laser light, the resin of the component (B) is preferably a resin having a structure that a fluorine atom is substituted to the main chain and/or the side chain of the polymer skeleton, and being capable of decomposing under the action of an acid to increase the solubility in an alkali developer (hereinafter sometimes referred to as a "fluorine group-containing resin"), more preferably a resin containing a hydroxyl group with the 1-position being substituted by a fluorine atom or a fluoroalkyl group or containing a group where the hydroxyl group with the 1-position being substituted by a fluorine atom or a fluoroalkyl group is protected by an acid-decomposable group, and still more preferably a resin having a hexafluoro-2-propanol structure or a structure that the hydroxyl group of hexafluoro-2-propanol is protected by an acid-decomposable group. By virtue of introducing a fluorine atom, the transparency to far ultraviolet light, particularly $F_2$ (157 nm) light, can be enhanced.

Preferred examples of the fluorine group-containing resin as the acid-decomposable resin (B) include a resin having at least one repeating unit represented by the following formulae (FA) to (FG):

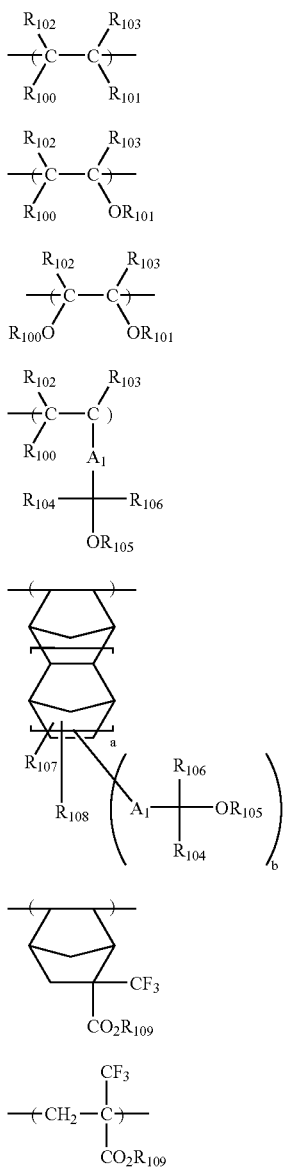

In these formulae, $R_{100}$ to $R_{103}$ each represents a hydrogen atom, a fluorine atom, an alkyl group or an aryl group.

$R_{104}$ and $R_{106}$ each is a hydrogen atom, a fluorine atom or an alkyl group, and at least either one of $R_{104}$ and $R_{106}$ is a fluorine atom or a fluoroalkyl group. $R_{104}$ and $R_{106}$ are preferably both a trifluoromethyl group.

$R_{105}$ is a hydrogen atom, an alkyl group, a cycloalkyl group, an acyl group, an alkoxycarbonyl group or a group capable of decomposing under the action of an acid.

$A_1$ is a single bond, a divalent linking group such as alkylene group, cycloalkylene group, alkenylene group, arylene group, —OCO—, —COO— and —CON($R_{24}$)—, or a linking group comprising a plurality of members out of these groups. $R_{24}$ is a hydrogen atom or an alkyl group.

$R_{107}$ and $R_{108}$ each is a hydrogen atom, a halogen atom, an alkyl group, an alkoxy group, an alkoxycarbonyl group or a group capable of decomposing under the action of an acid.

$R_{109}$ is a hydrogen atom, an alkyl group, a cycloalkyl group or a group capable of decomposing under the action of an acid.

a represents 0 or 1.

b is 0, 1 or 2.

In formulae (FA) and (FC), $R_{100}$ and $R_{101}$ may form a ring through an alkylene group (having a carbon number of 1 to 5) which may be substituted by fluorine.

The repeating units represented by formulae (FA) to (FG) each contains at least one fluorine atom, preferably 3 or more fluorine atoms, per one repeating unit.

In formulae (FA) to (FG), the alkyl group is, for example, an alkyl group having a carbon number of 1 to 8, and specific preferred examples thereof include a methyl group, an ethyl group, a propyl group, an n-butyl group, a sec-butyl group, a hexyl group, a 2-ethylhexyl group and an octyl group.

The cycloalkyl group may be monocyclic or polycyclic. The monocyclic type is preferably a cycloalkyl group having a carbon number of 3 to 8, such as cyclopropyl group, cyclopentyl group, cyclohexyl group, cycloheptyl group and cyclooctyl group. The polycyclic type is preferably a cycloalkyl group having a carbon number of 6 to 20, such as adamantyl group, norbornyl group, isoboronyl group, camphanyl group, dicyclopentyl group, α-pinel group, tricyclodecanyl group, tetracyclododecyl group and androstanyl group. In these monocyclic or polycyclic cycloalkyl groups, the carbon atom may be substituted by a heteroatom such as oxygen atom.

The fluoroalkyl group is preferably a fluoroalkyl group having a carbon number of 1 to 12, and specific preferred examples thereof include a trifluoromethyl group, a perfluoroethyl group, a perfluoropropyl group, a perfluorobutyl group, a perfluorohexyl group, a perfluorooctyl group, a perfluorooctylethyl group and a perfluorododecyl group.

The aryl group is, for example, an aryl group having a carbon number of 6 to 15, and specific preferred examples thereof include a phenyl group, a tolyl group, a dimethylphenyl group, a 2,4,6-trimethylphenyl group, a naphthyl group, an anthryl group and a 9,10-dimethoxyanthryl group.

The alkoxy group is, for example, an alkoxy group having a carbon number of 1 to 8, and specific preferred examples thereof include a methoxy group, an ethoxy group, an n-propoxy group, an iso-propoxy group, a butoxy group, a pentoxy group, an allyloxy group and an octoxy group.

The acyl group is, for example, an acyl group having a carbon number of 1 to 10, and specific preferred examples thereof include a formyl group, an acetyl group, a propanoyl group, a butanoyl group, a pivaloyl group, an octanoyl group and a benzoyl group.

The alkoxycarbonyl group is preferably a secondary alkoxycarbonyl group, more preferably a tertiary alkoxycarbonyl group, such as i-propoxycarbonyl group, tert-butoxycarbonyl group, tert-amyloxycarbonyl group and 1-methyl-1-cyclohexyloxycarbonyl group.

The halogen atom includes, for example, a fluorine atom, a chlorine atom, a bromine atom and an iodine atom.

The alkylene group is preferably an alkylene group having a carbon number of 1 to 8, such as methylene group, ethylene group, propylene group, butylene group, hexylene group and octylene group.

The alkenylene group is preferably an alkenylene group having a carbon number of 2 to 6, such as ethenylene group, propenylene group and butenylene group.

The cycloalkylene group is preferably a cycloalkylene group having a carbon number of 5 to 8, such as cyclopentylene group and cyclohexylene group.

The arylene group is preferably an arylene group having a carbon number of 6 to 15, such as phenylene group, tolylene group and naphthylene group.

These groups each may have a substituent, and examples of the substituent include those having active hydrogen, such as alkyl group, cycloalkyl group, aryl group, amino group, amido group, ureido group, urethane group, hydroxyl group and carboxyl group, a halogen atom (e.g., fluorine, chlorine, bromine, iodine), an alkoxy group (e.g., methoxy, ethoxy, propoxy, butoxy), a thioether group, an acyl group (e.g., acetyl, propanoyl, benzoyl), an acyloxy group (e.g., acetoxy, propanoyloxy, benzoyloxy), an alkoxycarbonyl group (e.g., methoxycarbonyl, ethoxycarbonyl, propoxycarbonyl), a cyano group and a nitro group.

Here, the alkyl group, cycloalkyl group and aryl group include those described above, and the alkyl group may be further substituted by a fluorine atom or a cycloalkyl group.

Examples of the group capable of decomposing under the action of an acid to exhibit alkali solubility, contained in the fluorine group-containing resin of the present invention, include —O—C($R_{36}$)($R_{37}$)($R_{38}$), —O—C($R_{36}$)($R_{37}$)(O$R_{39}$), —O—COO—C($R_{36}$)($R_{37}$)($R_{38}$), —O—C($R_{01}$)($R_{02}$)COO—C($R_{36}$)($R_{37}$)($R_{38}$), —COO—C($R_{36}$)($R_{37}$)($R_{38}$) and —COO—C($R_{36}$)($R_{37}$)(O$R_{39}$).

$R_{36}$ to $R_{39}$ each represents an alkyl group, a cycloalkyl group, an aryl group, an aralkyl group or an alkenyl group, and $R_{01}$ and $R_{02}$ each represents a hydrogen atom, an alkyl group, a cycloalkyl group, an alkenyl group (e.g., vinyl, allyl, butenyl, cyclohexenyl), an aralkyl group (e.g., benzyl, phenethyl, naphthylmethyl), or an aryl group.

Specific preferred examples include an ether or ester group of a tertiary alkyl group such as tert-butyl group, tert-amyl group, 1-alkyl-1-cyclohexyl group, 2-alkyl-2-adamantyl group, 2-adamantyl-2-propyl group and 2-(4-methylcyclohexyl)-2-propyl group, an acetal or acetal ester group such as 1-alkoxy-1-ethoxy group and tetrahydropyranyl group, a tert-alkylcarbonate group, and a tert-alkylcarbonylmethoxy group.

Specific examples of the repeating structural units represented by formulae (FA) to (FG) are set forth below, but the present invention is not limited thereto.

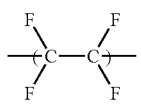 (F-1)

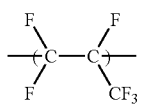 (F-2)

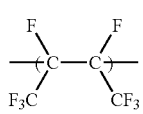 (F-3)

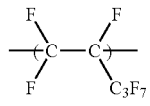 (F-4)

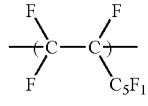 (F-5)

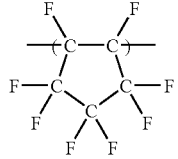 (F-6)

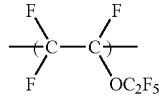 (F-7)

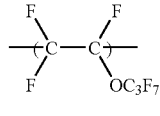 (F-8)

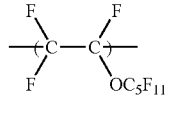 (F-9)

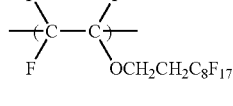 (F-10)

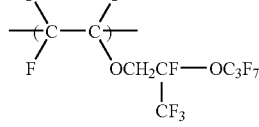 (F-11)

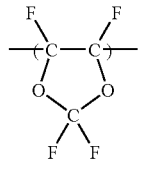 (F-12)

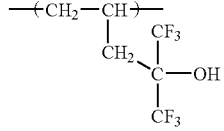 (F-13)

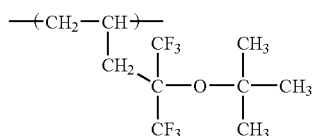 (F-14)

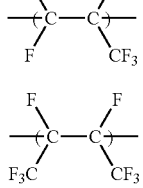 (F-15)

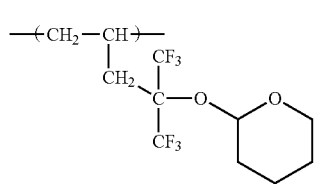 (F-16)
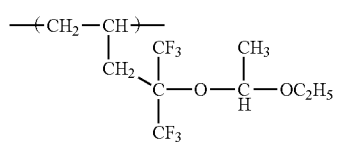 (F-17)
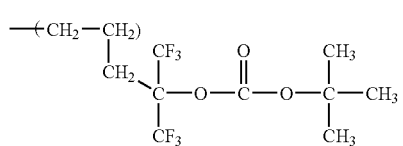 (F-18)
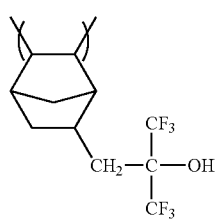 (F-19)
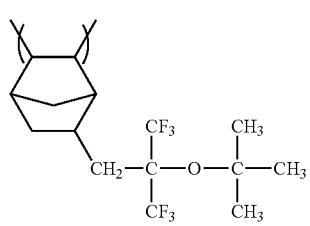 (F-20)
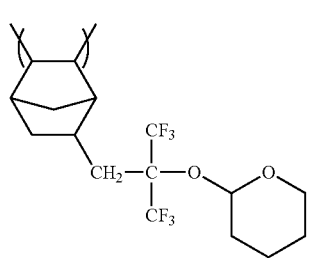 (F-21)
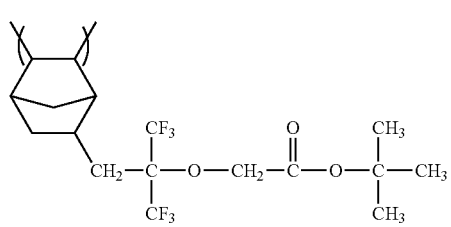 (F-22)
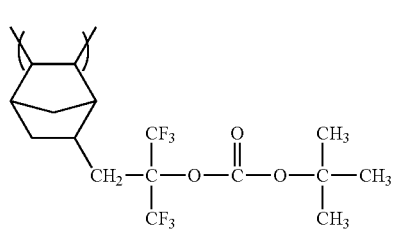 (F-23)
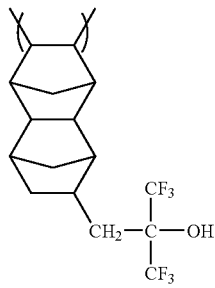 (F-24)
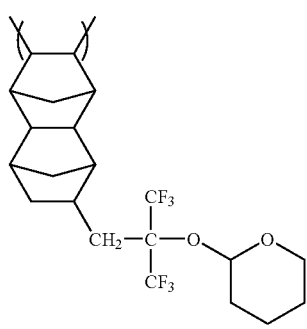 (F-25)
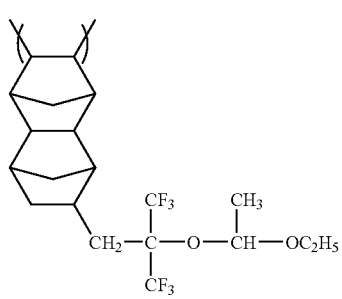 (F-26)
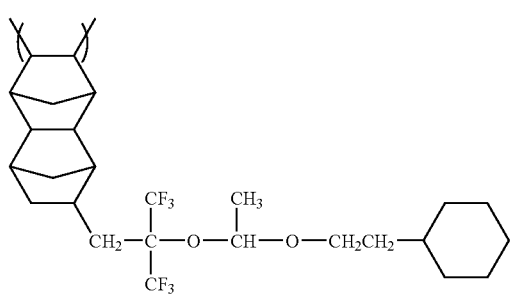 (F-27)
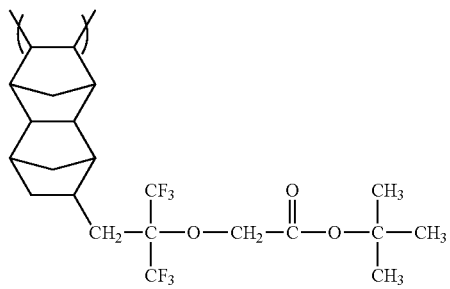 (F-28)

-continued
(F-29)
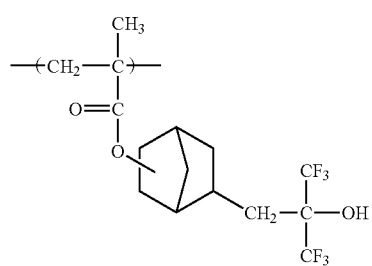
(F-30)
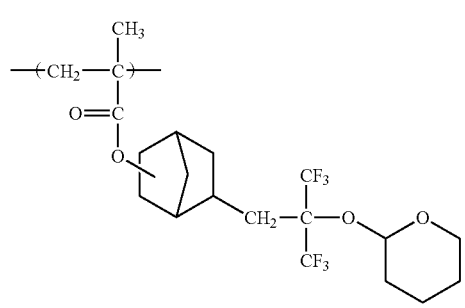
(F-31)
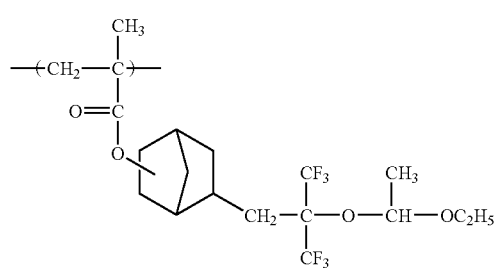
(F-32)
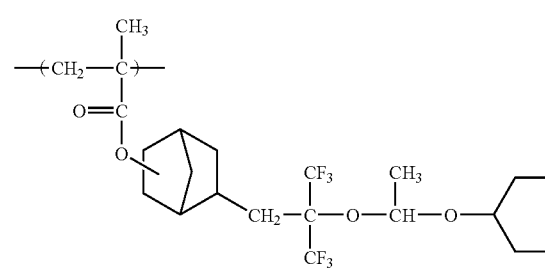
(F-33)
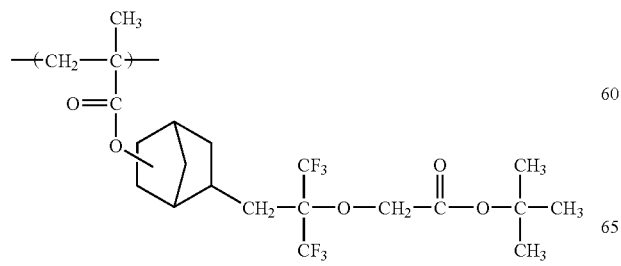
-continued
(F-34)
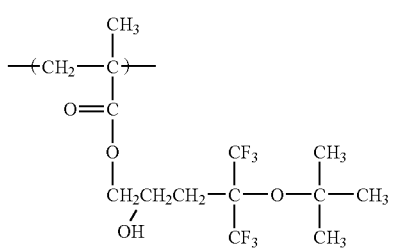
(F-35)
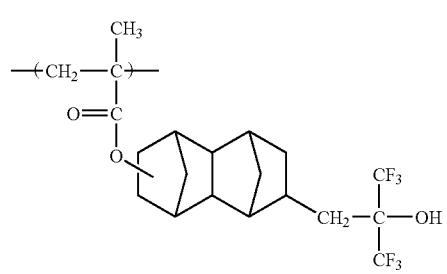
(F-36)
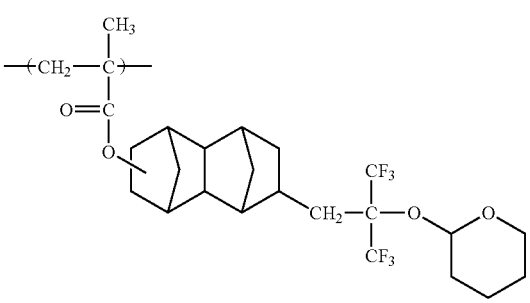
(F-37)
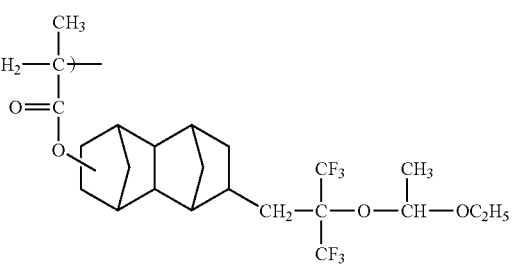
(F-38)
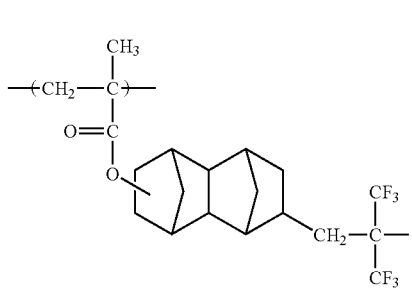

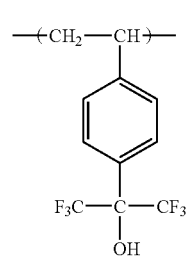 (F-39)
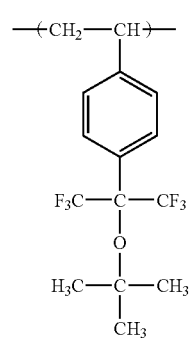 (F-40)
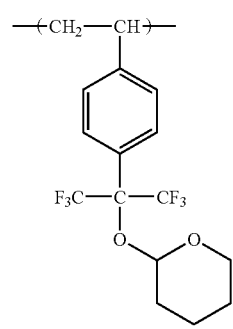 (F-41)
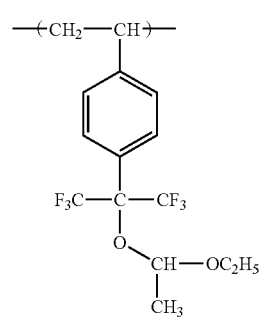 (F-42)
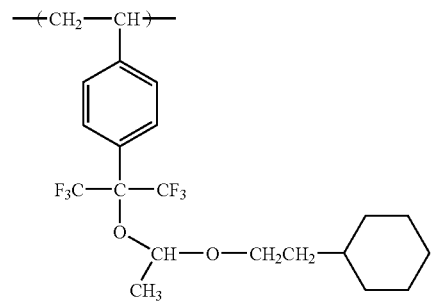 (F-43)
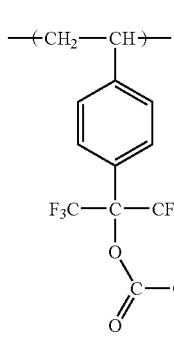 (F-44)
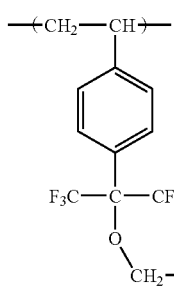 (F-45)
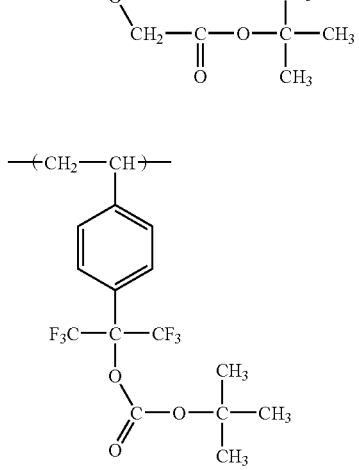 (F-46)
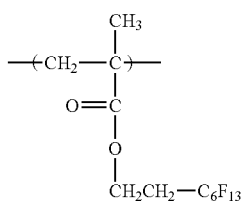 (F-47)
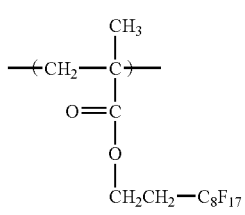 (F-48)

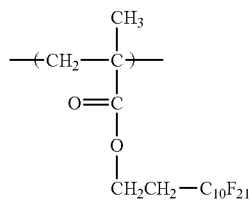 (F-49)
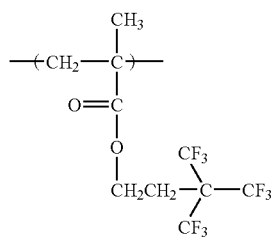 (F-50)
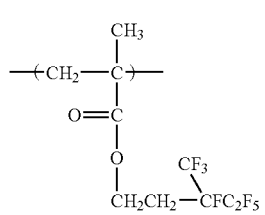 (F-51)
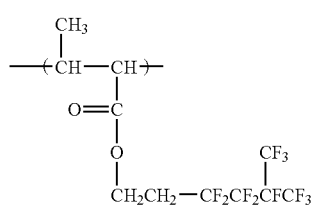 (F-52)
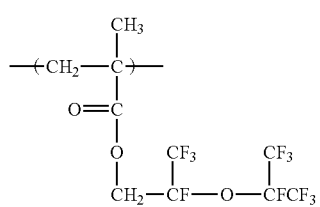 (F-53)
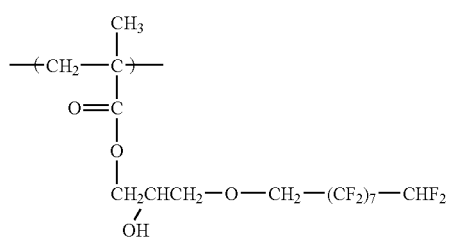 (F-54)
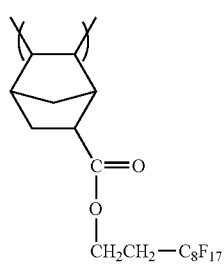 (F-55)
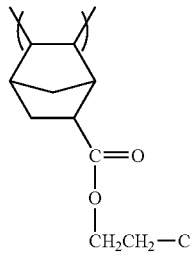 (F-56)
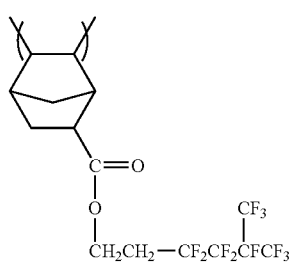 (F-57)
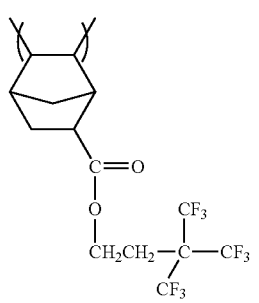 (F-58)
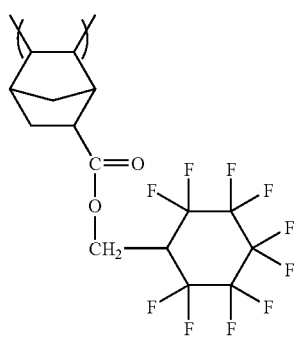 (F-59)
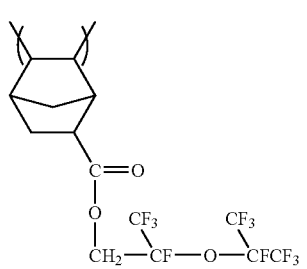 (F-60)

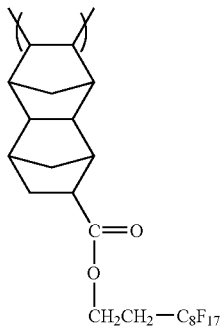

(F-61)

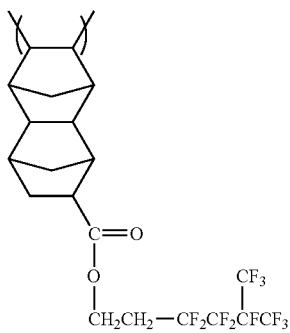

(F-62)

n = 8

(F-63)

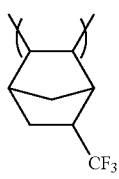

(F-64)

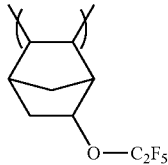

(F-65)

The total content of the repeating units represented by formulae (FA) to (FG) is generally from 10 to 80 mol %, preferably from 30 to 70 mol %, more preferably from 35 to 65 mol %, based on all repeating units constituting the resin.

In the fluorine group-containing resin, in addition to these repeating structural units, other polymerizable monomers may be copolymerized for enhancing the performance of the resist of the present invention.

Examples of the copolymerization monomer which can be used include a compound having one addition-polymerizable unsaturated bond, selected from acrylic acid esters other than those described above, acrylamides, methacrylic acid esters, methacrylamides, allyl compounds, vinyl ethers, vinyl esters, styrenes and crotonic acid esters.

From the standpoint of enhancing the dry etching resistance, controlling the alkali solubility and increasing the adhesion to substrate, the fluorine group-containing resin preferably contains another repeating unit as a copolymerization component in addition to the above-described fluorine atom-containing repeating unit. Preferred examples of the another repeating unit include:

1) a repeating unit having an alicyclic hydrocarbon structure represented by any one of formulae (pI) to (pVI) or formula (II-AB), specifically, repeating units 1 to 23 and repeating units [II-1] to [II-32], preferably repeating units 1 to 23 where Rx is $CF_3$;

2) a repeating unit having a lactone structure represented by formula (Lc) or any one of formulae (V-1) to (V-5), specifically, repeating units shown above, particularly, repeating units having a group represented by any one of formulae (Lc) and (V-1) to (V-4); and 3) a repeating unit represented by the following formula (XV), (XVI) or (XVII), which is derived from a maleic anhydride, a vinyl ether or a vinyl compound having a cyano group, specifically repeating units (C-1) to (C-15).

In these repeating units, a fluorine atom may or may not be contained.

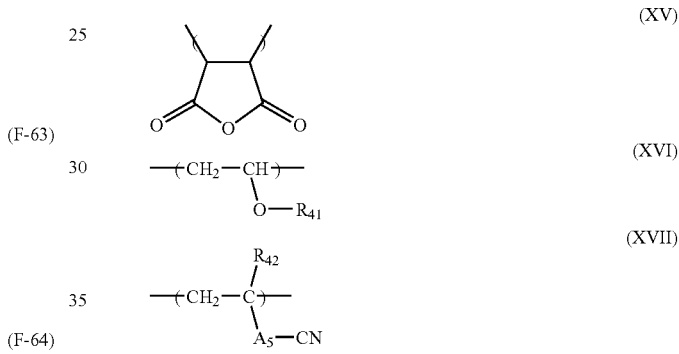

In these formulae, $R_{41}$ represents an alkyl group, a cycloalkyl group, an aralkyl group or an aryl group, and the alkyl group of $R_{41}$ may be substituted by an aryl group.

$R_{42}$ represents a hydrogen atom, a halogen atom a cyano group or an alkyl group.

$A_5$ represents a single bond, a divalent alkylene, alkenylene, cycloalkylene or arylene group, —O—CO—$R_{22}$—, —CO—O—$R_{23}$— or —CO—N($R_{24}$)—$R_{25}$—.

$R_{22}$, $R_{23}$ and $R_{25}$, which may be the same or different, each represents a single bond or a divalent alkylene, alkenylene, cycloalkylene or arylene group which may have an ether group, an ester group, an amide group, a urethane group or a ureido group.

$R_{24}$ represents a hydrogen atom, an alkyl group, a cycloalkyl group, an aralkyl group or an aryl group.

Examples of each substituent are the same as those described above for the substituents of formulae (FA) to (FG).

Specific examples of the repeating structural units represented by formulae (XV) to (XVII) are set forth below, but the present invention is not limited thereto.

(C-1)

-continued

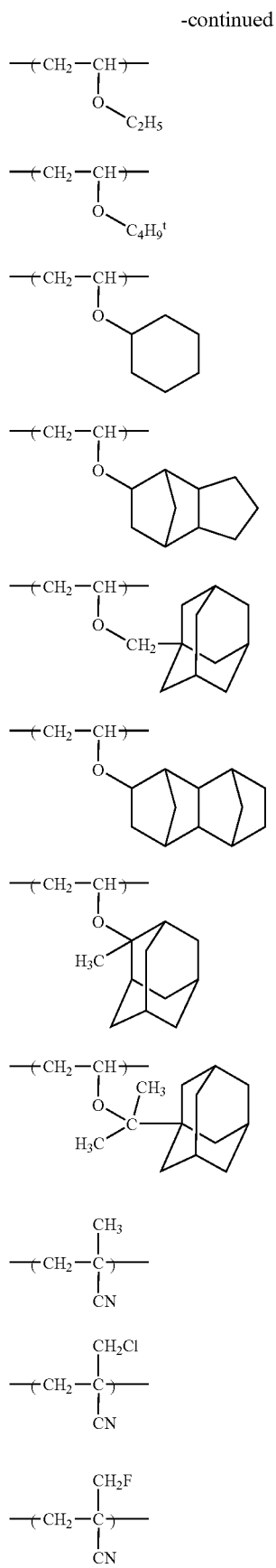

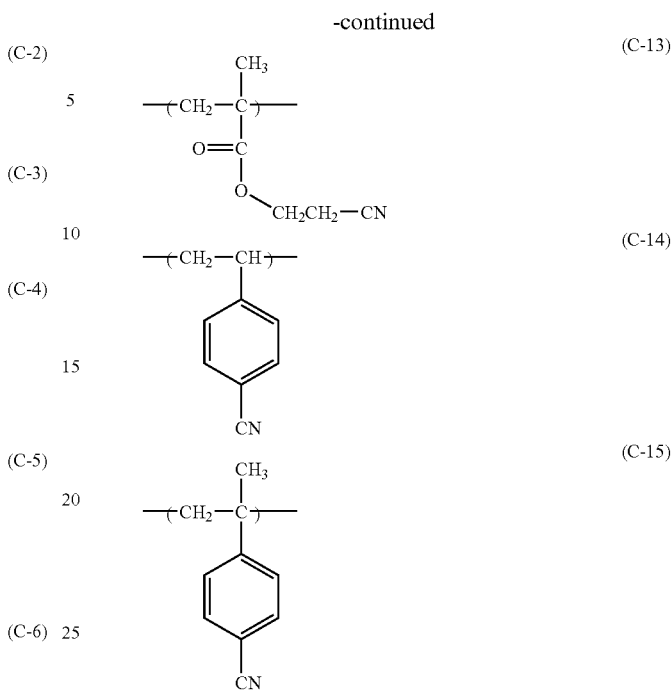

The total amount of the repeating unit represented by any one of formulae (XV) to (XVII) and the another repeating unit is generally from 0 to 70 mol %, preferably from 10 to 60 mol %, more preferably from 20 to 50 mol %, based on all repeating units constituting the resin.

The fluorine group-containing resin may contain an acid-decomposable group in any repeating unit.

The content of the repeating unit having an acid-decomposable group is preferably from 10 to 70 mol %, more preferably from 20 to 60 mol %, still more preferably from 30 to 60 mol %, based on all repeating units.

The fluorine group-containing resin can be synthesized by radical polymerization nearly in the same manner as the alicyclic hydrocarbon-based acid-decomposable resin.

The weight average molecular weight of the resin as the component (B) is preferably from 2,000 to 200,000 in terms of polystyrene by the GPC method. With a weight average molecular weight of 2,000 or more, heat resistance and dry etching resistance can be increased and with a weight average molecular weight of 200,000 or less, developability can be enhanced and at the same time, by virtue of decrease in the viscosity, the film-forming property can be improved. The molecular weight is more preferably from 5,000 to 50,000, still more preferably from 7,000 to 30,000. By adjusting the molecular weight, heat resistance, resolving power, development defect and the like of the composition all can be satisfied. The dispersity (Mw/Mn) of the resin as the component (B) is preferably from 1.0 to 3.0, more preferably from 1.2 to 2.5, still more preferably from 1.2 to 1.6. By adjusting the dispersity to an appropriate range, the line edge roughness performance can be enhanced.

In the resist composition of the present invention, the amount of the resin as the component (B) blended in the entire composition is preferably from 40 to 99.99 mass %, more preferably from 50 to 99 mass %, still more preferably from 80 to 96 mass %, based on the entire solid content.

<Component (C): Basic Compound>

The component (c) includes a nitrogen-containing basic compound such as organic amine, basic ammonium salt and basic sulfonium salt, and the nitrogen-containing basic compound may be sufficient if it does not deteriorate sublimation or resist performance.

Among these nitrogen-containing basic compounds, an organic amine is preferred because of excellent image performance.

Examples of the basic compound which can be used include those described in JP-A-63-149640, JP-A-5-249662, JP-A-5-127369, JP-A-5-289322, JP-A-5-249683, JP-A-5-289340, JP-A-5-232706, JP-A-5-257282, JP-A-6-242605, JP-A-6-242606, JP-A-6-266100, JP-A-6-266110, JP-A-6-317902, JP-A-7-120929, JP-A-7-146558, JP-A-7-319163, JP-A-7-508840, JP-A-7-333844, JP-A-7-219217, JP-A-7-92678, JP-A-7-28247, JP-A-8-22120, JP-A-8-110638, JP-A-8-123030, JP-A-9-274312, JP-A-9-166871, JP-A-9-292708, JP-A-9-325496, JP-T-7-508840, and U.S. Pat. Nos. 5,525,453, 5,629,134 and 5,667,938.

Preferred examples of the structure thereof include the structures represented by the following formulae (A) to (E).

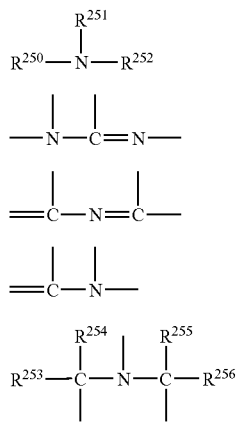

In these formulae, $R^{250}$, $R^{251}$ and $R^{252}$ each independently represents a hydrogen atom, an alkyl group having a carbon number of 1 to 20, a cycloalkyl group having a carbon number of 3 to 20, or an aryl group having a carbon number of 6 to 20, and $R^{250}$ and $R^{251}$ may combine with each other to form a ring. These groups each may have a substituent. The alkyl or cycloalkyl group having a substituent is preferably an aminoalkyl group having a carbon number of 1 to 20, an aminocycloalkyl group having a carbon number of 3 to 20, a hydroxyalkyl group having a carbon number of 1 to 20, or a hydroxycycloalkyl group having a carbon number of 3 to 20.

These groups each may contain an oxygen atom, a sulfur atom or a nitrogen atom in the alkyl chain.

$R^{253}$, $R^{254}$, $R^{255}$ and $R^{256}$ each independently represents an alkyl group having a carbon number of 1 to 6 or a cycloalkyl group having a carbon number of 3 to 6.

Preferred examples of the compound include guanidine, aminopyrrolidine, pyrazole, pyrazoline, piperazine, aminomorpholine, aminoalkylmorpholine and piperidine, and these compounds each may have a substituent. More preferred examples of the compound include a compound having an imidazole structure, a diazabicyclo structure, an onium hydroxide structure, an onium carboxylate structure, a trialkylamine structure, an aniline structure or a pyridine structure; an alkylamine derivative having a hydroxyl group and/or an ether bond; and an aniline derivative having a hydroxyl group and/or an ether bond.

Examples of the compound having an imidazole structure include imidazole, 2,4,5-triphenylimidazole and benzimidazole. Examples of the compound having a diazabicyclo structure include 1,4-diazabicyclo[2,2,2]octane, 1,5-diazabicyclo[4,3,0]non-5-ene and 1,8-diazabicyclo[5,4,0]undec-7-ene. Examples of the compound having an onium hydroxide structure include a triarylsulfonium hydroxide, a phenacylsulfonium hydroxide and a sulfonium hydroxide having a 2-oxoalkyl group, specifically, triphenylsulfonium hydroxide, tris(tert-butylphenyl)sulfonium hydroxide, bis(tert-butylphenyl)iodonium hydroxide, phenacylthiophenium hydroxide and 2-oxopropylthiophenium hydroxide. The compound having an onium carboxylate structure is a compound where the anion moiety of the compound having an onium hydroxide structure is converted into a carboxylate, and examples thereof include acetate, adamantane-1-carboxylate and perfluoroalkyl carboxylate. Examples of the compound having a trialkylamine structure include tri(n-butyl)amine and tri(n-octyl)amine. Examples of the aniline compound include 2,6-diisopropylaniline and N,N-dimethylaniline. Examples of the alkylamine derivative having a hydroxyl group and/or an ether bond include ethanolamine, diethanolamine, triethanolamine and tris-(methoxyethoxyethyl)amine. Examples of the aniline derivative having a hydroxyl group and/or an ether bond include N,N-bis(hydroxyethyl)aniline.

One of these basic compounds may be used alone, or two or more thereof may be used in combination. The amount of the basic compound used is usually from 0.001 to 10 mass %, preferably from 0.01 to 5 mass %, based on the solid content of the resist composition. The amount used is preferably 0.001 mass % or more for obtaining a sufficiently high addition effect and preferably 10 mass % or less in view of sensitivity and developability of the unexposed area.

<Component (D): Surfactant>

As for the component (D), examples thereof include a nonionic surfactant such as polyoxyethylene alkyl ethers, polyoxyethylene alkylallyl ethers, polyoxyethylene-polyoxy-propylene block copolymers, sorbitan aliphatic esters and polyoxyethylene sorbitan aliphatic esters. One of these surfactants may be added alone, or several members thereof may be added in combination.

The resist composition preferably contains, as the surfactant, any one fluorine- and/or silicon-containing surfactant (a fluorine-containing surfactant, a silicon-containing surfactant or a surfactant containing both a fluorine atom and a silicon atom), or two or more thereof.

Examples of the fluorine- and/or silicon-containing surfactant include surfactants described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, and U.S. Pat. Nos. 5,405,720, 5,360,692, 5,529,881, 5,296,330, 5,436,098, 5,576,143, 5,294,511 and 5,824,451. The following commercially available surfactants each may also be used as it is.

Examples of the commercially available surfactant include a fluorine-containing or silicon-containing surfactant such as EFtop EF301 and EF303 (produced by Shin-Akita Kasei K.K.); Florad FC430 and 431 (produced by Sumitomo 3M Inc.); Megafac F171, F173, F176, F189 and R08 (produced by Dainippon Ink & Chemicals, Inc.); Surflon S-382, SC101, 102, 103, 104, 105 and 106 (produced by Asahi Glass Co., Ltd.); and Troysol S-366 (produced by Troy Chemical). In addition, polysiloxane polymer KP-341 (produced by Shin-Etsu Chemical Co., Ltd.) may also be used as the silicon-containing surfactant.

Other than these known surfactants, a surfactant using a polymer having a fluoro-aliphatic group, which is derived from a fluoro-aliphatic compound produced by telomerization process (also called telomer process) or oligomerization process (also called oligomer process), may be used. The fluoro-aliphatic compound can be synthesized by the method described in JP-A-2002-90991.

The polymer having a fluoro-aliphatic group is preferably a copolymer of a fluoro-aliphatic group-containing monomer with a (poly(oxyalkylene)) acrylate and/or a (poly(oxyalkylene)) methacrylate, and the polymer may have an irregular distribution or may be a block copolymer. Examples of the poly(oxyalkylene) group include a poly(oxyethylene) group, a poly(oxypropylene) group and a poly(oxybutylene) group. This group may also be a unit having alkylenes differing in the chain length within the same chain, such as block-linked poly(oxyethylene, oxypropylene and oxyethylene) and block-linked poly(oxyethylene and oxypropylene). Furthermore, the copolymer of a fluoro-aliphatic group-containing monomer with a (poly(oxyalkylene)) acrylate (or methacrylate) may be not only a binary copolymer but also a ternary or higher copolymer obtained by simultaneously copolymerizing two or more different fluoro-aliphatic group-containing monomers or two or more different (poly(oxyalkylene)) acrylates (or methacrylates).

Examples thereof include commercially available surfactants such as Megafac F-178, F-470, F-473, F-475, F-476 and F-472 (produced by Dainippon Ink & Chemicals, Inc.); a copolymer of an acrylate (or methacrylate) having a $C_6F_{13}$ group with a (poly(oxyalkylene)) acrylate (or methacrylate); a copolymer of an acrylate (or methacrylate) having a $C_6F_{13}$ group with a (poly(oxyethylene)) acrylate (or methacrylate) and a (poly(oxypropylene)) acrylate (or methacrylate); a copolymer of an acrylate (or methacrylate) having a $C_8F_{17}$ group with a (poly(oxyalkylene)) acrylate (or methacrylate); and a copolymer of an acrylate (or meth-acrylate) having a $C_8F_{17}$ group with a (poly(oxyethylene)) acrylate (or methacrylate) and a (poly(oxypropylene)) acrylate (or methacrylate).

The amount of the surfactant used is preferably from 0.0001 to 2 mass %, more preferably from 0.001 to 1 mass %, based on the entire amount of the resist composition (excluding the solvent).

<Component (E): Solvent>

As for the component (E), preferred examples thereof include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethylsulfoxide, N-methylpyrrolidone and tetrahydrofuran. These solvents are used alone or as a mixture.

Among these solvents, preferred are 2-heptanone, γ-butyrolactone, ethylene glycol monomethyl ether, ethylene glycol monoethyl ether, ethylene glycol monoethyl ether acetate, propylene glycol monomethyl ether, propylene glycol monomethyl ether, methyl lactate, ethyl lactate, methyl methoxypropionate, ethyl ethoxypropionate, N-methylpyrrolidone and tetrahydrofuran.

<Component F: Dissolution Inhibiting Compound Capable of Decomposing Under the Action of an Acid to Increase the Solubility in an Alkali Developer and having a Molecular Weight of 3,000 or Less>

In order to prevent reduction in the transparency to light at 220 nm or less, the dissolution inhibiting compound capable of decomposing under the action of an acid to increase the solubility in an alkali developer and having a molecular weight of 3,000 or less is preferably an alicyclic or aliphatic compound having an acid-decomposable group, such as acid-decomposable group-containing cholic acid derivatives described in Proceeding of SPIE, 2724, 355 (1996). Examples of the acid-decomposable group and alicyclic structure are the same as those described above for the alicyclic hydrocarbon-based acid-decomposable resin.

In the case where the resist composition of the present invention is exposed to a KrF excimer laser or irradiated with electron beams, the dissolution inhibiting compound preferably contains a structure in which the phenolic hydroxyl group of a phenol compound is replaced by an acid-decomposable group. The phenol compound preferably contains from 1 to 9 phenol skeletons, more preferably from 2 to 6 phenol skeletons.

The molecular weight of the dissolution inhibiting compound is 3,000 or less, preferably from 300 to 3,000, more preferably from 500 to 2,500.

The amount of the dissolution inhibiting compound added is preferably from 3 to 50 mass %, more preferably from 5 to 40 mass %, based on the solid content of the resist composition.

Specific examples of the dissolution inhibiting compound are set forth below, but the present invention is not limited thereto.

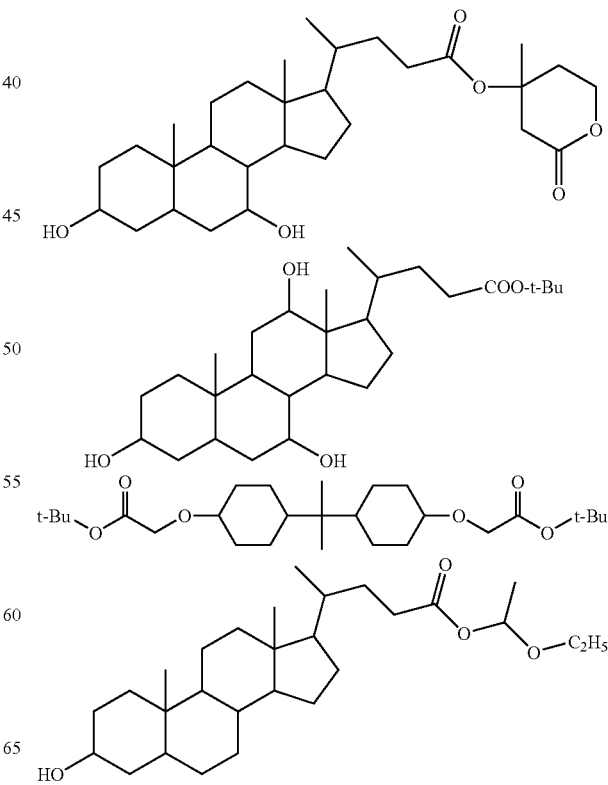

-continued

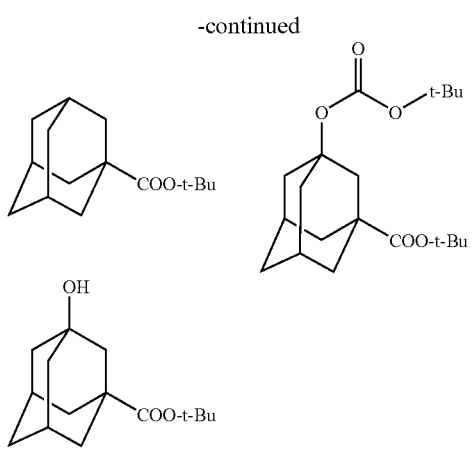

<Component (G): Resin Soluble in an Alkali Developer>

The alkali dissolution rate of the resin soluble in an alkali developer (alkali-soluble resin) is preferably 20 Å/sec or more, more preferably 200 Å/sec or more (Å is angstrom), as measured (at 23° C.) in 0.261 N tetramethylammonium hydroxide (TMAH).

Examples of the alkali-soluble resin include, but are not limited to, a novolak resin, a hydrogenated novolak resin, an acetone-pyrogallol resin, an o-polyhydroxystyrene, an m-polyhydroxystyrene, a p-polyhydroxystyrene, a hydrogenated polyhydroxystyrene, a halogen- or alkyl-substituted polyhydroxystyrene, a hydroxystyrene-N-substituted maleimide copolymer, an o/p- or m/p-hydroxystyrene copolymer, a polyhydroxystyrene with the hydroxyl group being partially O-alkylated (for example, from 5 to 30 mol % O-methylated, O-(1-methoxy)ethylated, O-(1-ethoxy)ethylated, O-2-tetrahydropyranylated or O-(tert-butoxycarbonyl)methylated) or O-acylated (for example, from 5 to 30 mol % o-acylated or O-(tert-butoxy)carbonylated), a styrene-maleic anhydride copolymer, a styrene-hydroxystyrene copolymer, an α-methylstyrene-hydroxystyrene copolymer, a carboxyl group-containing methacrylic resin including a derivative thereof, and a polyvinyl alcohol derivative.

Among these alkali-soluble resins, preferred are a novolak resin, an o-polyhydroxystyrene, an m-polyhydroxystyrene, a p-polyhydroxystyrene, a copolymer thereof, an alkyl-substituted polyhydroxystyrene, a partially O-alkylated or O-acylated polyhydroxystyrene, a styrene-hydroxystyrene copolymer and an α-methylstyrene-hydroxystyrene copolymer.

The novolak resin can be obtained by subjecting a predetermined monomer as the main component to addition condensation with an aldehyde in the presence of an acidic catalyst.

The weight average molecular weight of the alkali-soluble resin is 2,000 or more, preferably from 5,000 to 200,000, more preferably from 5,000 to 100,000.

The weight average molecular weight used herein is defined as a polystyrene-reduced value measured by gel permeation chromatography.

As for the alkali-soluble resin, two or more kinds of alkali-soluble resins may be used in combination.

The amount of the alkali-soluble resin used is from 40 to 97 mass %, preferably from 60 to 90 mass %, based on the entire solid content of the resist composition.

<Component (H): Acid Crosslinking Agent Capable of Crosslinking with the Alkali-soluble Resin Under the Action of an Acid In the case of a negative resist composition, the resist composition contains a crosslinking agent.

For example, in the case of a negative type such as negative resist which is used with a KrF excimer laser, a resist pattern is formed by reducing the dissolution rate in the developer, for example, through a crosslinking reaction between a crosslinking agent and a resin brought about by a catalytic reaction of an acid generated in the exposed area. Therefore, a crosslinking agent is sometimes required.

Examples of the crosslinking agent which can be used include an amino resin such as glycoluril resin disclosed in JP-A-1-293339 and JP-A-2-15270, a glycoluril resin crosslinking agent disclosed in JP-A-5-34922, a crosslinking agent comprising an N-(alkoxymethyl)glycoluril compound disclosed in JP-A-6-301200, and an N-(alkoxyalkyl)glycoluril or N-(alkoxyalkyl)melamine compound disclosed in JP-A-2003-302670.

The crosslinking agent may be any compound as long as it can crosslink the resin soluble in an alkali developer under the action of an acid, but the following compounds (1) to (3) are preferred:

(1) a hydroxymethyl, alkoxymethyl or acyloxymethyl form of a phenol derivative, (2) a compound having an N-hydroxymethyl group, an N-alkoxymethyl group or an N-acyloxymethyl group, and (3) a compound having an epoxy group.

The alkoxymethyl group is preferably an alkoxymethyl group having a carbon number of 6 or less, and the acyloxymethyl group is preferably an acyloxymethyl group having a carbon number of 6 or less.

Among these crosslinking agents, particularly preferred are set forth below.

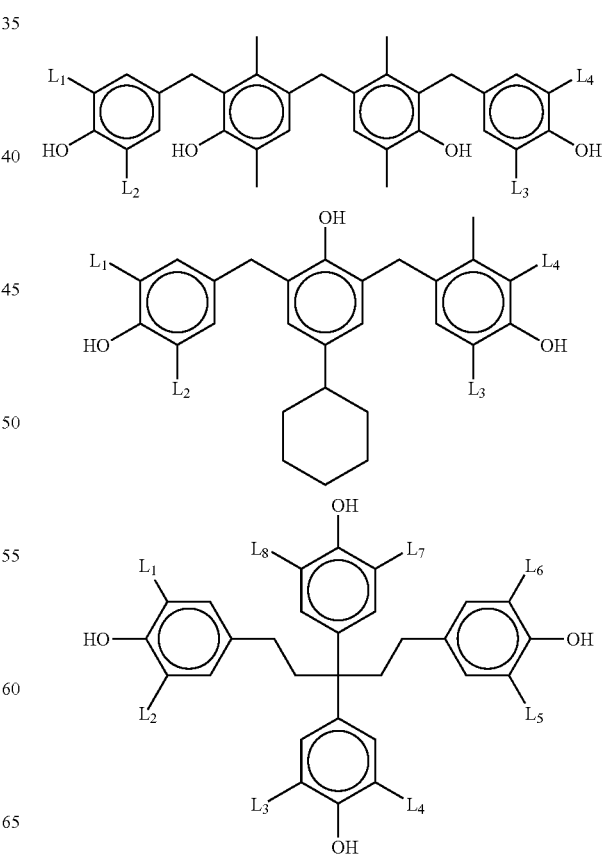

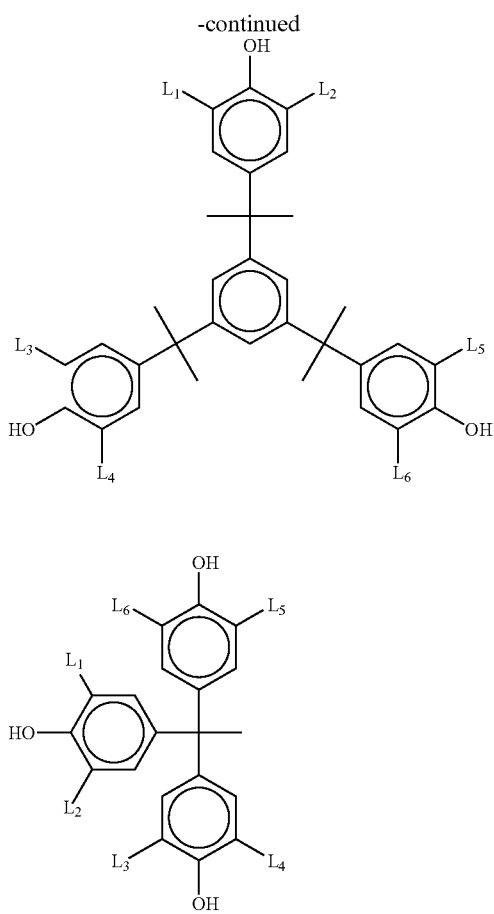

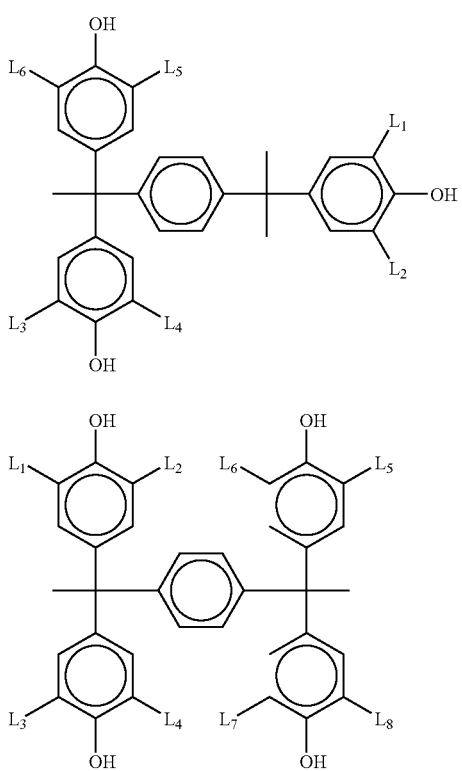

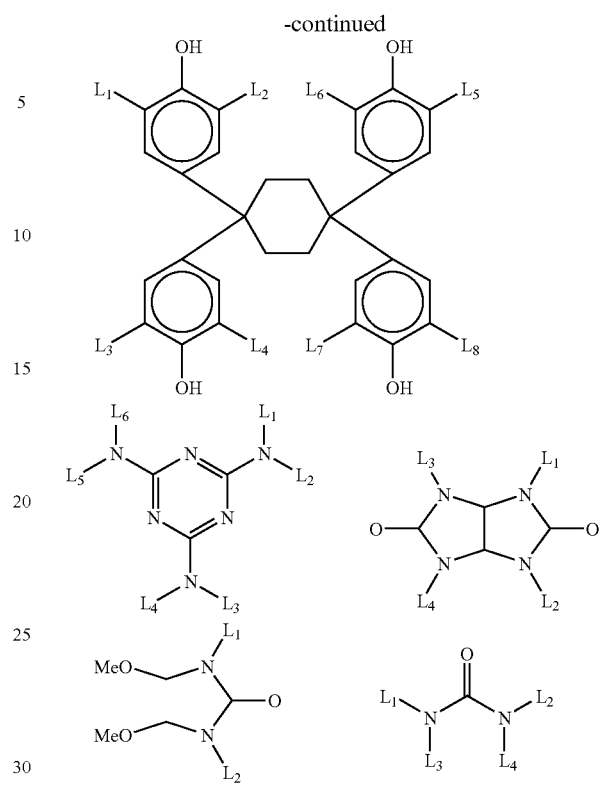

In these formulae, $L^1$ to $L^8$, which may be the same or different, each represents a hydrogen atom, a hydroxymethyl group, a methoxymethyl group, an ethoxymethyl group or an alkyl group having a carbon number of 1 to 6.

The crosslinking agent is usually added in an amount of 3 to 70 mass %, preferably from 5 to 50 mass %, based on the solid content of the resist composition.

<Other Additives>

The resist composition of the present invention may further contain, if desired, a dye, a plasticizer, a photosensitizer, a compound capable of accelerating the solubility in a developer, and the like.

All of these additives are also preferably used in the solution state at the production of the resist composition.

The compound capable of accelerating the dissolution in a developer, which can be used in the present invention, is a low molecular compound containing two or more phenolic OH groups or one or more carboxy group and having a molecular weight of 1,000 or less. In the case of containing a carboxyl group, an alicyclic or aliphatic compound is preferred.

The amount of the dissolution accelerating compound added is preferably from 2 to 50 mass %, more preferably from 5 to 30 mass %, based on the resin of the component (B) and the resin of the component (G). The amount added is preferably 50 mass % or less from the standpoint of suppressing the development residue or preventing the deformation of pattern at the development.

The phenol compound having a molecular weight of 1,000 or less can be easily synthesized by one skilled in the art with reference to the method described, for example, in JP-A-4-122938, JP-A-2-28531, U.S. Pat. No. 4,916,210 and European Patent 219294.

Specific examples of the alicyclic or aliphatic compound having a carboxy group include, but are not limited to, a carboxylic acid derivative having a steroid structure, such as cholic acid, deoxycholic acid and lithocholic acid, an adamantane carboxylic acid derivative, an adamantane dicarboxylic acid, a cyclohexanecarboxylic acid and a cyclohexanedicarboxylic acid.

<Pattern Forming Method Using Resist Composition>

The resist composition is coated on a substrate to form a thin film. The thickness of the coated film is preferably from 0.05 to 1.5 μm. In the present invention, a commercially available inorganic or organic antireflection film may be used, if desired.

The antireflection film which can be used includes an inorganic film type such as titanium, titanium dioxide, titanium nitride, chromium oxide, carbon, α-silicon and silicon nitride, and an organic film type comprising a light absorbent and a polymer material. The former requires equipment for the film formation, such as vacuum vapor-deposition apparatus, CVD apparatus and sputtering apparatus. Examples of the organic antireflection film include a film comprising a condensate of diphenylamine derivative with formaldehyde-modified melamine resin, an alkali-soluble resin and a light absorbent described in JP-B-7-69611, a reaction product of a maleic anhydride copolymer and a diamine-type light absorbent described in U.S. Pat. No. 5,294,680, a film comprising a resin binder and a methylolmelamine-based heat crosslinking agent described in JP-A-6-118631, an acrylic resin-type antireflection film containing a carboxylic acid group, an epoxy group and a light absorbing group within the same molecule described in JP-A-6-118656, a film comprising methylolmelamine and a benzophenone-based light absorbent described in JP-A-8-87115, and a film obtained by adding a low molecular light absorbent to a polyvinyl alcohol resin described in JP-A-8-179509. Also, for example, DUV Series and ARC Series produced by Brewer Science, Inc., and AC Series and AR Series produced by Shipley Co., Ltd., may be used as the organic antireflection film.

The resist solution is coated on a substrate (e.g., silicon/silicon dioxide-coated substrate) as used in the production of a precision integrated circuit device (if desired, on a substrate having provided thereon the above-described antireflection film) by an appropriate coating method such as spinner or coater, then exposed through a predetermined mask, baked and developed, whereby a good resist pattern can be obtained. The exposure light used here is preferably light at a wavelength of 150 to 250 nm, and specific examples thereof include KrF excimer laser light (248 nm), ArF excimer laser light (193 nm), $F_2$ excimer laser light (157 nm), X-ray and electron beam.

The alkali developer usable at the development is an alkaline aqueous solution of inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine. This alkaline developer may be used after adding thereto alcohols and a surfactant each in an appropriate amount.

The alkali concentration of the alkali developer is usually from 0.1 to 20 mass %.

The pH of the alkali developer is usually from 10.0 to 15.0.

EXAMPLES

The present invention is described in greater detail below by referring to Examples, but the present invention should not be construed as being limited thereto.

[Synthesis of Resin (B-2) Used in Positive Resist for Exposure with KrF Excimer Laser]

p-tert-Butoxystyrene monomer (35.2 g (0.2 mol)) and 5.21 g (0.05 mol) tert-Bu styrene monomer, which had been subjected to dehydration and purification by distillation according to an ordinary method, were dissolved in 100 ml of tetrahydrofuran and in a nitrogen stream, 0.033 g of azobisisobutyronitrile (AIBN) was added thereto with stirring at 80° C. three times every 2.5 hours. The stirring was further continued for 5 hours, thereby performing the polymerization reaction. The reaction solution was poured in 1,200 ml of hexane to precipitate a white resin, and the obtained resin was dried and then dissolved in 150 ml of tetrahydrofuran. Subsequently, 4N hydrochloric acid was added thereto, and the resulting solution was refluxed under heat for 6 hours, thereby effecting hydrolysis. The obtained hydrolysate was reprecipitated in 5 L of ultrapure water, and this resin was separated by filtration, washed with water, dried and further dissolved in 200 ml of tetrahydrofuran. The resulting solution was added dropwise in 5 L of ultrapure water with vigorous stirring, thereby effecting reprecipitation. This reprecipitation operation was repeated 3 times. The obtained resin was dried in a vacuum drier at 120° C. for 12 hours to obtain a poly(p-hydroxystyrene/tert-butyl styrene) copolymer as Alkali-Soluble Resin (B-1). The weight average molecular weight of this resin was 12,000.

Resin (B-1) (20 g) and propylene glycol monomethyl ether acetate (320 g) were dissolved in a flask, and the resulting solution was distilled under reduced pressure to azeotropically remove water and PGMEA by distillation. After confirming that the water content was sufficiently reduced, 24 g of ethyl vinyl ether and 0.35 g of p-toluenesulfonic acid were added, followed by stirring at room temperature for 1 hour. Furthermore, 0.28 g of triethylamine was added thereto to quench the reaction and after adding ethyl acetate, the reaction solution was washed with water and distilled under reduced pressure to remove ethyl acetate, water and azeotrope PGMEA by distillation. In this way, Alkali-Soluble Resin (B-2) having a substituent according to the present invention was obtained.

[Synthesis of Resin (B-3) Used in Negative Resist for Exposure with KrF Excimer Laser]

p-tert-Butoxystyrene (100 g), 19.7 g of styrene, 8.1 g of azobisisobutyronitrile and 2.5 g of tert-dodecylmercaptane were dissolved in 180 g of propylene glycol monomethyl ether, and the polymerization reaction was performed at 80° C. for 9 hours. The polymerization solution was purified by reprecipitation with methanol to obtain 100 g of a p-tert-butoxy styrene/styrene copolymer (Mw: 72,00, Mw/Mn: 1.80). Subsequently, this copolymer and 50 g of 10 mass % aqueous sulfuric acid were dissolved in 300 g of propylene glycol monomethyl ether, and the hydrolysis reaction was performed at 90° C. for 6 hours. The reaction solution was purified by reprecipitation with a large amount of water until the solution became neutral, whereby Resin (B-3) which is a p-hydroxystyrene/styrene (=75/25 mol %) copolymer was obtained. The weight average molecular weight of this resin was 5,200.

[Synthesis of Resin (B-4) Used in Positive Resist for Exposure with ArF Excimer Laser]

2-Methyl-2-adamantyl methacrylate, 3-hydroxy-1-adamantyl methacrylate and butyrolactone methacrylate were charged at a ratio of 40/20/40 (by mol) and dissolved in methyl ethyl ketone/tetrahydrofuran (=5/5) to prepare 100 mL of a solution having a solid content concentration of 20 mass %. Subsequently, 2 mol % of polymerization initiator V-65 produced by Wako Pure Chemical Industries, Ltd. was added to this solution, and the resulting solution was added dropwise to 10 mL of methyl ethyl ketone heated to 60° C. over 4 hours in a nitrogen atmosphere. After the completion of dropwise addition, the reaction solution was heated for 4 hours, and 1 mol % of V-65 was again added, followed by stirring for 4 hours. After the completion of reaction, the reaction solution was cooled to room temperature and then crystallized with 3 L of a mixed solvent of distilled water/ISO propyl alcohol (1/1 by mass) to obtain Resin (B-4) which is the white powder precipitated. The polymer compositional ratio determined from $^{13}$CNMR was 41/21/38. The weight average molecular weight of this resin was 10,700.

[Description of Abbreviations]
PGMEA: propylene glycol monomethyl ether acetate
PGME: propylene glycol monomethyl ether
PAG-1 triphenylsulfonium nonaflate
AMINE-1: 2,6-diisopropylaniline
ADD-1: N,N,N,N-tetra(methoxymethyl)glycoluril
W-1: Megafac R08 (produced by Dainippon Ink & Chemicals, Inc.)

Example 1

Resin (B-4) was dissolved in a mixed solvent of PGMEA and PGME (60/40 by mass) to prepare a solution having a solid content concentration of 20 mass %, and PAG-1 was dissolved in a mixed solvent of PGMEA and PGME (60/40 by mass) to prepare a solution having a solid content concentration of 20 mass %. The solution (30 g) of Resin (B-4), the solution (1.5 g) of PAG-1, AMINE-1 (0.12 g), W-1 (0.01 g), PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Example 2

Resin (B-4) was dissolved in a mixed solvent of PGMEA and PGME (60/40 by mass) to prepare a solution having a solid content concentration of 20 mass %, PAG-1 was dissolved in a mixed solvent of PGMEA and PGNM (60/40 by mass) to prepare a solution having a solid content concentration of 20 mass %, AMINE-1 was dissolved in a mixed solvent of PGMEA and PGME (60/40 by mass) to prepare a solution having a solid content concentration of 10 mass %, and W-1 was dissolved in a mixed solvent of PGMEA and PGME (60/40 by mass) to prepare a solution having a solid content concentration of 10 mass %. The solution (30 g) of Resin (B-4), the solution (1.5 g) of PAG-1, the solution (1.2 g) of AMINE-1, the solution (0.1 g) of W-1, PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Example 3

Resin (B-4) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %. The solution (30 g) of Resin (B-4), the solution (1.5 g) of PAG-1, AMINE-1 (0.12 g), W-1 (0.01 g), PGMEA (42 g) and PGME (28 g) were mixed, and the obtained mixed solution was filtered through a 0.05-μm PE-made filter (47 mm UPE Membrane Disks, produced by Mykrolis Corporation) to prepare a positive resist composition.

Example 4

Resin (B-4) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %, AMINE-1 was dissolved in a mixed solvent of PGMEA and PGME (60/40 by mass) to prepare a solution having a solid content concentration of 10 mass %, and W-1 was dissolved in a mixed solvent of PGMEA and PGME (60/40 by mass) to prepare a solution having a solid content concentration of 10 mass %. The solution (30 g) of Resin (3-4), the solution (1.5 g) of PAG-1, the solution (1.2 g) of AMNE-1, the solution (0.1 g) of W-1, PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Example 5

Resin (3-4) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %, and this solution was filtered through a 0.1-μm PE-made filter (47 mm UPE Membrane Disks, produced by Mykrolis Corporation). The solution (30 g) of Resin (B-4), the solution (1.5 g) of PAG-1, AMINE-1 (0.12 g), W-1 (0.01 g), PGMEA (42 g) and PGME (28 g) were mixed, and the obtained mixed solution was filtered through a 0.05-μm PE-made filter (47 mm UPE Membrane Disks, produced by Mykrolis Corporation) to prepare a positive resist composition.

Example 6

Resin (B-4) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %, and this solution was filtered through a 0.1-μm PE-made filter (47 mm UPE Membrane Disks, produced by Mykrolis Corporation).

AMN-1 was dissolved in a mixed solvent of PGMEA and PGME (60/40 by mass) to prepare a solution having a solid content concentration of 10 mass %, and W-1 was dissolved in a mixed solvent of PGMEA and PGME (60/40 by mass) to prepare a solution having a solid content concentration of 10 mass %. The solution (30 g) of Resin (B-4), the solution (1.5 g) of PAG-1, the solution (1.2 g) of AMNE-1, the solution (0.1 g) of W-1, PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Example 7

Resin (B-4) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %, and this solution was filtered through a 0.1-μm PE-made filter (47 mm UPE Membrane Disks, produced by Mykrolis Corporation). AMINE-1 was dissolved in a mixed solvent of PGMEA and PGME (60/40 by mass) to prepare a solution having a solid content concentration of 10 mass %, and this solution was filtered through a 0.1-μm PE-made filter (47 mm UPE Membrane Disks, produced by Mykrolis Corporation). W-1 was dissolved in a mixed solvent of PGMEA and PGME (60/40 by mass) to prepare a solution having a solid content concentration of 10 mass %, and this solution was filtered through a 0.1-μm PE-made filter (47 mm UPE Membrane Disks, produced by Mykrolis Corporation). The solution (30 g) of Resin (B-4), the solution (1.5 g) of PAG-1, the solution (1.2 g) of AMINE-1, the solution (0.1 g) of W-1, PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Example 8

Resin (B-2) was dissolved in a mixed solvent of PGMEA and PGME (60/40 by mass) to prepare a solution having a solid content concentration of 20 mass %, and PAG-1 was dissolved in a mixed solvent of PGMEA and PGME (60/40 by mass) to prepare a solution having a solid content concentration of 20 mass %. The solution (30 g) of Resin (B-2), the solution (1.5 g) of PAG-1, AMINE-1 (0.12 g), W-1 (0.01 g), PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Example 9

Resin (B-2) was dissolved in a mixed solvent of PGMEA and PGME (60/40 by mass) to prepare a solution having a solid content concentration of 20 mass %, PAG-1 was dissolved in a mixed solvent of PGMEA and PGME (60/40 by mass) to prepare a solution having a solid content concentration of 20 mass %, AMINE-1 was dissolved in a mixed solvent of PGMEA and PGME (60/40 by mass) to prepare a solution having a solid content concentration of 10 mass %, and W-1 was dissolved in a mixed solvent of PGMEA and PGME (60/40 by mass) to prepare a solution having a solid content concentration of 10 mass %. The solution (30 g) of Resin (B-2), the solution (1.5 g) of PAG-1, the solution (1.2 g) of AMINE-1, the solution (0.1 g) of W-1, PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Example 10

Resin (B-2) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %. The solution (30 g) of Resin (B-2), the solution (1.5 g) of PAG-1, AMINE-1 (0.12 g), W-1 (0.01 g), PGMEA (42 g) and PGME (28 g) were mixed, and the obtained mixed solution was filtered through a 0.05-μm PE-made filter (47 mm UPE Membrane Disks, produced by Mykrolis Corporation) to prepare a positive resist composition.

Example 11

Resin (13-2) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %, AMINE-1 was dissolved in a mixed solvent of PGMEA and PGME (60/40 by mass) to prepare a solution having a solid content concentration of 10 mass %, and W-1 was dissolved in a mixed solvent of PGMEA and PGME (60/40 by mass) to prepare a solution having a solid content concentration of 10 mass %. The solution (30 g) of Resin (B-2), the solution (1.5 g) of PAG-1, the solution (1.2 g) of AMNE-1, the solution (0.1 g) of W-1, PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Example 12

Resin (B-2) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %, and this solution was filtered through a 0.1-μm PE-made filter (47 mm UPE Membrane Disks, produced by Mykrolis Corporation). The solution (30 g) of Resin (B-2), the solution (1.5 g) of PAG-1, AMINE-1 (0.12 g), W-1 (0.01 g), PGMEA (42 g) and PGME (28 g) were mixed, and the obtained mixed solution was filtered through a 0.05-μm PE-made filter (47 mm UPE Membrane Disks, produced by Mykrolis Corporation) to prepare a positive resist composition.

Example 13

Resin (B-2) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %, and this solution was filtered through a 0.1-μm PE-made filter (47 mm UPE Membrane Disks, produced by Mykrolis Corporation). AMINE-1 was dissolved in a mixed solvent of PGMEA and PGME (60/40 by mass) to prepare a solution having a solid content concentration of 10 mass %, and W-1 was dissolved in a mixed solvent of PGMEA and PGME (60/40 by mass) to prepare a solution having a solid content concentration of 10 mass %. The solution (30 g) of Resin (B-2), the solution (1.5 g) of PAG-1, the solution (1.2 g) of AMINE-1, the solution (0.1 g) of W-1, PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Example 14

Resin (B-2) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %, and this solution was filtered through a 0.1-μm PE-made filter (47 mm UPE Membrane Disks, produced by Mykrolis Corporation). AMINE-1 was dissolved in a mixed solvent of PGMEA and PGME (60/40 by mass) to prepare a solution having a solid content concentration of 10 mass %, and this solution was filtered through a 0.1-μm PE-made filter (47 mm UPE Membrane Disks, produced by Mykrolis Corporation). W-1 was dissolved in a mixed solvent of PGMEA and PGME (60/40 by mass) to prepare a solution having a solid content concentration of 10 mass %, and this solution was filtered through a 0.1-μm PE-made filter (47 mm UPE Membrane Disks, produced by Mykrolis Corporation). The solution (30 g) of Resin (B-2), the solution (1.5 g) of PAG-1, the solution (1.2 g) of AMINE-1, the solution (0.1 g) of W-1, PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Example 15

Resin (B-3) was dissolved in a mixed solvent of PGMEA and PGME (60/40 by mass) to prepare a solution having a solid content concentration of 20 mass %, and PAG-1 was dissolved in a mixed solvent of PGMEA and PGME (60/40 by mass) to prepare a solution having a solid content concentration of 20 mass %. The solution (30 g) of Resin (B-3), the solution (1.5 g) of PAG-1, AMNE-1 (0.12 g), ADD-1 (0.3 g), W-1 (0.01 g), PGMEA (42 g) and PGME (28 g) were mixed, and the obtained mixed solution was filtered through a 0.02-μm PE-made filter (47 mm UPE Membrane Disks, produced by Mykrolis Corporation) to prepare a negative resist composition.

Example 16

Resin (B-3) was dissolved in a mixed solvent of PGMEA and PGME (60/40 by mass) to prepare a solution having a solid content concentration of 20 mass %, PAG-1 was dissolved in a mixed solvent of PGMEA and PGME (60/40 by mass) to prepare a solution having a solid content concentration of 20 mass %, AMINE-1 was dissolved in a mixed solvent of PGMEA and PGME (60/40 by mass) to prepare a solution having a solid content concentration of 10 mass %, ADD-I was dissolved in a mixed solvent of PGMEA and PGME (60/40 by mass) to prepare a solution having a solid content concentration of 10 mass %, and W-1 was dissolved in a mixed solvent of PGMEA and PGME (60/40 by mass) to prepare a solution having a solid content concentration of 10 mass %. The solution (30 g) of Resin (B-3), the solution (1.5 g) of PAG-1, the solution (1.2 g) of AMINE-1, the solution (1.5 g) of ADD-1, the solution (0.1 g) of W-1, PGMEA (42 g) and PGME (28 g) were mixed, and the obtained mixed solution was filtered through a 0.02-μm PE-made filter (47 mm UPE Membrane Disks, produced by Mykrolis Corporation) to prepare a negative resist composition.

Example 17

Resin (B-3) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %. The solution (30 g) of Resin (B-3), the solution (1.5 g) of PAG-1, AMINE-1 (0.12 g), ADD-1 (0.3 g), W-1 (0.01 g), PGMEA (42 g) and PGME (28 g) were mixed, and the obtained mixed solution was filtered through a 0.05-μm PE-made filter (47 mm UPE Membrane Disks, produced by Mykrolis Corporation) to prepare a negative resist composition.

Example 18

Resin (B-3) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %, AME-1 was dissolved in a mixed solvent of PGMEA and PGME (60/40 by mass) to prepare a solution having a solid content concentration of 10 mass %, ADD-1 was dissolved in a mixed solvent of PGMEA and PGME (60/40 by mass) to prepare a solution having a solid content concentration of 10 mass %, and W-1 was dissolved in a mixed solvent of PGMEA and PGME (60/40 by mass) to prepare a solution having a solid content concentration of 10 mass %. The solution (30 g) of Resin (B-3), the solution (1.5 g) of PAG-1, the solution (1.2 g) of AMINE-1, the solution (1.5 g) of ADD-1, the solution (0.1 g) of W-1, PGMEA (42 g) and PGME (28 g) were mixed, and the obtained mixed solution was filtered through a 0.02-μm PE-made filter (47 mm UPE Membrane Disks, produced by Mykrolis Corporation) to prepare a negative resist composition.

Example 19

Resin (B-3) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %, and this solution was filtered through a 0.1-μm PE-made filter (47 mm UPE Membrane Disks, produced by Mykrolis Corporation). The solution (30 g) of Resin (B-3), the solution (1.5 g) of PAG-1, AMINE-1 (0.12 g), ADD-1 (0.3 g), W-1 (0.01 g), PGMEA (42 g) and PGME (28 g) were mixed, and the obtained mixed solution was filtered through a 0.05-μm PE-made filter (47 mm UPE Membrane Disks, produced by Mykrolis Corporation) to prepare a negative resist composition.

Example 20

Resin (B-3) was dissolved in a mixed solvent of PGMEA and PGME (60/40. by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %, and this solution was filtered through a 0.1-μm PE-made filter (47 mm UPE Membrane Disks, produced by Mykrolis Corporation). AMINE-1 was dissolved in a mixed solvent of PGMEA and PGME (60/40 by mass) to prepare a solution having a solid content concentration of 10 mass %, ADD-1 was dissolved in a mixed solvent of PGMEA and PGME (60/40 by mass) to prepare a solution having a solid content concentration of 10 mass %, and W-1 was dissolved in a mixed solvent of PGMEA and PGME (60/40 by mass) to prepare a solution having a solid content concentration of 10 mass %. The solution (30 g) of Resin (B-3), the solution (1.5 g) of PAG-1, the solution (1.2 g) of AMINE-1, the solution (1.5 g) of ADD-1, the solution (0.1 g) of W-1, PGMEA (42 g) and PGME (28 g) were mixed, and the obtained mixed solution was filtered through a 0.02-μm PE-made filter (47 mm UPE Membrane Disks, produced by Mykrolis Corporation) to prepare a negative resist composition.

Example 21

Resin (B-3) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). PAG-1 was dissolved in a mixed solvent of PGMEA and PGME (60/40 by mass) to prepare a solution having a solid content concentration of 20 mass %, and this solution was filtered through a 0.1-μm PE-made filter (47 mm UPE Membrane Disks, produced by Mykrolis Corporation). AMINE-1 was dissolved in a mixed solvent of PGMEA and PGME (60/40 by mass) to prepare a solution having a solid content concentration of 10 mass %, and this solution was filtered through a 0.1-μm PE-made filter (47 mm UPE Membrane Disks, produced by Mykrolis Corporation). ADD-1 was dissolved in a mixed solvent of PGMEA and PGME (60/40 by mass) to prepare a solution having a solid content concentration of 10 mass %, and this solution was filtered through a 0.1-μm PE-made filter (47 mm UPE Membrane Disks, produced by Mykrolis Corporation). W-1 was dissolved in a mixed solvent of PGMEA and PGME (60/40 by mass) to prepare a solution having a solid content concentration of 10 mass %, and this solution was filtered through a 0.1-μm PE-made filter (47 mm UPE Membrane Disks, produced by Mykrolis Corporation). The solution (30 g) of Resin (B-3), the solution (1.5 g) of PAG-1, the solution (1.2 g) of AMINE-1, the solution (1.5 g) of ADD-1, the solution (0.1 g) of W-1, PGMEA (42 g) and PGME (28 g) were mixed, and the obtained mixed solution was filtered through a 0.02-μm PE-made filter (47 mm UPE Membrane Disks, produced by Mykrolis Corporation) to prepare a negative resist composition.

Comparative Example 1

Resin (B-4) (6 g), PAG-1 (0.3 g), AMINE-1 (0.12 g), W-1 (0.01 g), PGMEA (56 g) and PGME (38 g) were mixed, and the obtained mixed solution was filtered through a 0.02-μm PE-made filter (47 mm UPE Membrane Disks, produced by Mykrolis Corporation) to prepare a positive resist composition.

Comparative Example 2

Resin (B-4) was dissolved in a mixed solvent of PGMEA and PGME (60/40 by mass) to prepare a solution having a solid content concentration of 20 mass %. The solution (30 g) of Resin (B-4), PAG-1 (0.3 g), AMINE-1 (0.12 g), W-1 (0.01 g), PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Comparative Example 3

Resin (B-4) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). The solution (30 g) of Resin (B-4), PAG-1 (0.3 g), AMINE-1 (0.12 g), W-1 (0.01 g), PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Comparative Example 4

Resin (B-2) (6 g), PAG-1 (0.3 g), AMINE-1 (0.12 g), W-1 (0.01 g), PGMEA (56 g) and PGME (38 g) were mixed, and the obtained mixed solution was filtered through a 0.02-μm PE-made filter (47 mm UPE Membrane Disks, produced by Mykrolis Corporation) to prepare a positive resist composition.

Comparative Example 5

Resin (B-2) was dissolved in a mixed solvent of PGMEA and PGME (60/40 by mass) to prepare a solution having a solid content concentration of 20 mass %. The solution (30 g) of Resin (B-2), PAG-1 (0.3 g), AMINE-1 (0.12 g), W-1 (0.01 g), PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Comparative Example 6

Resin (B-2) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). The solution (30 g) of Resin (B-2), PAG-1 (0.3 g), AMINE-1 (0.12 g), W-1 (0.01 g), PGMEA (42 g) and PGME (28 g) were mixed, and the obtained mixed solution was filtered through a 0.02-μm PE-made filter (47 mm UPE Membrane Disks, produced by Mykrolis Corporation) to prepare a positive resist composition.

Comparative Example 7

Resin (B-3) (6 g), PAG-1 (0.3 g), AMINE-1 (0.12 g), ADD-1 (0.3 g), W-1 (0.01 g), PGMEA (56 g) and PGME (38 g) were mixed, and the obtained mixed solution was filtered through a 0.02-μm PE-made filter (47 mm UPE Membrane Disks, produced by Mykrolis Corporation) to prepare a negative resist composition.

Comparative Example 8

Resin (B-3) was dissolved in a mixed solvent of PGMEA and PGME (60/40 by mass) to prepare a solution having a solid content concentration of 20 mass %. The solution (30 g) of Resin (B-3), PAG-1 (0.3 g), AMINE-1 (0.12 g), ADD-1 (0.3 g), W-1 (0.01 g), PGMEA (42 g) and PGME (28 g) were mixed, and the obtained mixed solution was filtered through a 0.02-μm PE-made filter (47 mm UPE Membrane Disks, produced by Mykrolis Corporation) to prepare a negative resist composition.

Comparative Example 9

Resin (B-3) was dissolved in a mixed solvent of PGMEA and PGME (60/40 by mass) to prepare a solution having a solid content concentration of 20 mass %, and this solution was filtered through a 1.0-μm PE-made filter (47 mm UPE Membrane Disks, produced by Mykrolis Corporation). The solution (30 g) of Resin (B-3), PAG-1 (0.3 g), AMINE-1 (0.12 g), ADD-1 (0.3 g), W-1 (0.01 g), PGMEA (42 g) and PGME (28 g) were mixed, and the obtained mixed solution was filtered through a 0.02-μm PE-made filter (47 mm UPE Membrane Disks, produced by Mykrolis Corporation) to prepare a negative resist composition.

[Resist Pattern Formation of Examples 1 to 7 and Comparative Examples 1 to 3]

ARC29A produced by Brewer Science Co., Ltd. was uniformly coated on a silicon wafer by a spin coater to a thickness of 78 nm and dried under heating at 205° C. for 60 seconds to form an antireflection film. Thereafter, each positive resist composition immediately after preparation was coated by a spin coater and dried at 120° C. for 60 seconds (PB) to form a resist film of 150 nm.

This resist film was exposed through a 6% halftone mask having a 110 nm line-and-space pattern by using an ArF excimer laser stepper (PAS5500/1100, manufactured by ASML, NA=0.75 (2/3 annular illumination)) and immediately after the exposure, heated on a hot plate at 120° C. for 60 seconds (PEB). Furthermore, the resist film was developed with an aqueous 2.38 mass % tetramethylammonium hydroxide solution at 23° C. for 60 seconds, rinsed with pure water for 30 seconds and then dried to obtain a 110 nm line-and-space resist pattern.

[Resist Pattern Formation of Examples 8 to 14 and Comparative Examples 4 to 6]

ARC29A produced by Brewer Science Co., Ltd. was uniformly coated on a silicon wafer by a spin coater to a thickness of 78 nm and dried under heating at 205° C. for 60 seconds to form an antireflection film. Thereafter, each positive resist composition immediately after preparation was coated by a spin coater and dried at 120° C. for 60 seconds (PB) to form a resist film of 150 nm.

This resist film was exposed through a 6% halftone mask having a 200 nm line/120 nm space pattern by using a KrF excimer laser (FPA-3000EX5, manufactured by Canon Inc., wavelength: 248 nm, NA=0.63, σ=0.65) and immediately after the exposure, heated on a hot plate at 100° C. for 60 seconds (PEB). Furthermore, the resist film was developed with an aqueous 2.38 mass % tetramethylammonium hydroxide solution at 23° C. for 60 seconds, rinsed with pure water for 30 seconds and then dried to obtain a 210 nm line/110 nm space resist pattern.

[Resist Pattern Formation of Examples 15 to 21 and Comparative Examples 7 to 9]

ARC29A produced by Brewer Science Co., Ltd. was uniformly coated on a silicon wafer by a spin coater to a thickness of 78 nm and dried under heating at 205° C. for 60 seconds to form an antireflection film. Thereafter, each positive resist composition immediately after preparation was coated by a spin coater and dried at 110° C. for 60 seconds (PB) to form a resist film of 150 nm.

This resist film was exposed through a 6% halftone mask having a 120 nm line/200 nm space pattern by using a KrF excimer laser (FPA-3000EX5, manufactured by Canon Inc., wavelength: 248 nm, NA=0.63, σ=0.65) and immediately after the exposure, heated on a hot plate at 110° C. for 60 seconds (PEB). Furthermore, the resist film was developed with an aqueous 2.38 mass % tetramethylammonium hydroxide solution at 23° C. for 60 seconds, rinsed with pure water for 30 seconds and then dried to obtain a 210 nm line/110 nm space resist pattern.

[Evaluation of Development Defect]

The number of development defects in the repeating pattern obtained in the evaluation of pattern falling above was measured (threshold: 12, pixel size: 0.39) by Model KLA2112 (manufactured by KLA-Tencor Corporation). The evaluation results are shown in Tables 1 to 3 below by the number of defects on each wafer.

TABLE 1

| | | ArF exposure (positive) | | |
|---|---|---|---|---|
| | | Component Added as Solution | Component Treated with Filter | Development Defect (number of defects) |
| Example | 1 | A, B | — | 165 |
| | 2 | all | — | 130 |
| | 3 | A, B | B | 25 |

TABLE 1-continued

ArF exposure (positive)

|  |  | Component Added as Solution | Component Treated with Filter | Development Defect (number of defects) |
|---|---|---|---|---|
|  | 4 | all | B | 20 |
|  | 5 | A, B | A, B | 6 |
|  | 6 | all | A, B | 5 |
|  | 7 | all | all | 3 |
| Comparative Example | 1 | (all as powder) | — | 340 |
|  | 2 | B | — | 348 |
|  | 3 | B | B | 233 |

TABLE 2

KrF exposure (positive)

|  |  | Component Added as Solution | Component Treated with Filter | Development Defect (number of defects) |
|---|---|---|---|---|
| Example | 8 | A, B | — | 317 |
|  | 9 | all | — | 285 |
|  | 10 | A, B | B | 68 |
|  | 11 | all | B | 59 |
|  | 12 | A, B | A, B | 15 |
|  | 13 | all | A | 15 |
|  | 14 | all | all | 9 |
| Comparative Example | 4 | (all as powder) | — | 756 |
|  | 5 | B | — | 687 |
|  | 6 | B | B | 385 |

TABLE 3

KrF exposure (negative)

|  |  | Component Added as Solution | Component Treated with Filter | Development Defect (number of defects) |
|---|---|---|---|---|
| Example | 15 | A, B | — | 451 |
|  | 16 | all | — | 426 |
|  | 17 | A, B | B | 75 |
|  | 18 | all | B | 59 |
|  | 19 | A, B | A, B | 38 |
|  | 20 | all | A, B | 29 |
|  | 21 | all | all | 17 |
| Comparative Example | 7 | (all as powder) | — | 859 |
|  | 8 | B | — | 638 |
|  | 9 | B | B | 395 |

In Tables 1 to 3, A indicates a photoacid generator as the component (A) and B indicates a resin as the component (B).

It is seen that the resist compositions produced by the process of the present invention ensure less generation of development defects on a pattern.

The entire disclosure of each and every foreign patent application from which the benefit of foreign priority has been claimed in the present application is incorporated herein by reference, as if fully set forth.

What is claimed is:

1. A production process of a chemical amplification-type resist composition, which is a process for producing a chemical amplification-type composition comprising: (A) a compound capable of generating an acid upon irradiation with actinic rays or radiation; (B) a resin of which solubility in an alkali developer is changed under an action of an acid; (C) a basic compound; (D) a surfactant; and (E) a solvent, the production process comprising:

preparing a solution containing the component (A);

preparing a solution containing the component (B);

filtering the solution containing the component (B) through a first filter; and mixing the solution containing the component (A) with the solution containing the component (B) and with the components (C) to (E).

2. A production process of a chemical amplification-type resist composition, which is a process for producing a chemical amplification-type composition comprising: (A) a compound capable of generating an acid upon irradiation with actinic rays or radiation; (B) a resin of which solubility in an alkali developer is changed under an action of an acid; (C) a basic compound; (D) a surfactant; and (E) a solvent, the production process comprising:

preparing four solutions containing the components (A) to (D), respectively; and mixing the components (A) to (E) with each other as solutions.

3. The production process of a chemical amplification-type resist composition according to claim 1, wherein the first filter has an average pore size of 2.0 m or less.

4. The production process of a chemical amplification-type resist composition according to claim 1, which further comprises:

filtering the solution containing the component (A) through a second filter before mixing the solution containing component (A) with the solution containing component (B) and with the components (C) to (E).

5. The production process of a chemical amplification-type resist composition according to claim 4, wherein the second filter has an average pore size of 0.4 μm or less.

6. The production process of a chemical amplification-type resist composition according to claim 2, which further comprises:

filtering the two solutions containing the components (C) and (D), respectively through a first filter.

7. The production process of a chemical amplification-type resist composition according to claim 6, wherein the first filter has an average pore size of 0.4 μm or less.

8. The production process of a chemical amplification-type resist composition according to claim 1, which further comprises:

filtering the mixed solution containing the components (A) to (E) through a second filter having an average pore size of 0.05 μm or less.

9. The production process of a chemical amplification-type resist composition according to claim 2, which further comprises:

filtering the solution containing the component (B) through a first filter before mixing the components (A) to (E).

10. The production process of a chemical amplification-type resist composition according to claim 9, which further comprises:

filtering the solution containing the component (A) through a second filter before mixing the components (A) to (E).

11. The production process of a chemical amplification-type resist composition according to claim 10, which further comprises:

filtering the two solutions containing the components (C) and (D), respectively through the second fitter before mixing the components (A) to (E).

12. The production process of a chemical amplification-type resist composition according to claim 11, which further comprises:

filtering the mixed solution containing the components (A) to (E) through a third filter having an average pore size of 0.0.5 μm or less.

13. The production process of a chemical amplification-type resist composition according to claim 2, which further comprises:

filtering the solution containing the component (A) through a first filter before mixing the components (A) to (E).

14. The production process of a chemical amplification-type resist composition according to claim 9, wherein the first filter has an average pore size of 2.0 μm or less.

15. The production process of a chemical amplification-type resist composition according to claim 11, wherein the second filter has an average pore size of 0.4 μm or less.

16. The production process of a chemical amplification-type resist composition according to claim 12, wherein the first filter has an average pore size of 2.0 m or less and the second filter has an average pore size of 0.4 μm or less.

* * * * *